United States Patent
Kim et al.

(10) Patent No.: US 12,557,502 B2
(45) Date of Patent: Feb. 17, 2026

(54) DISPLAY APPARATUS

(71) Applicant: Samsung Display Co., Ltd., Yongin-Si (KR)

(72) Inventors: Hanbit Kim, Yongin-si (KR); Hyena Kwak, Yongin-si (KR); Jiyeong Shin, Yongin-si (KR); Yunjung Oh, Yongin-si (KR); Dokyeong Lee, Yongin-si (KR); Sanggun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/988,899

(22) Filed: Dec. 20, 2024

(65) Prior Publication Data

US 2025/0127001 A1 Apr. 17, 2025

Related U.S. Application Data

(62) Division of application No. 18/373,970, filed on Sep. 28, 2023, now Pat. No. 12,213,361.

(30) Foreign Application Priority Data

Oct. 28, 2022 (KR) .................. 10-2022-0141610

(51) Int. Cl.
*G09G 3/3233* (2016.01)
*H10K 59/121* (2023.01)
*H10K 59/131* (2023.01)

(52) U.S. Cl.
CPC ....... *H10K 59/131* (2023.02); *H10K 59/1213* (2023.02); *H10K 59/1216* (2023.02)

(58) Field of Classification Search
None
See application file for complete search history.

(56) References Cited

U.S. PATENT DOCUMENTS

| | | |
|---|---|---|
| 9,202,409 B2 | 12/2015 | Han |
| 9,269,303 B2 | 2/2016 | Senda |
| 9,953,567 B2 | 4/2018 | Wang |
| 10,964,267 B2 | 3/2021 | Park et al. |
| 11,081,056 B2 | 8/2021 | Park et al. |
| 2014/0071110 A1 | 3/2014 | Han et al. |
| 2021/0151539 A1 | 5/2021 | Yun et al. |
| 2022/0278183 A1* | 9/2022 | Wang ................ H10K 59/1213 |

FOREIGN PATENT DOCUMENTS

| | | |
|---|---|---|
| KR | 10-1082234 B1 | 11/2011 |
| KR | 10-2014-0123219 A | 10/2014 |
| KR | 10-2016-0061570 A | 6/2016 |
| KR | 10-2018-0060436 A | 6/2018 |
| KR | 10-2018-0093147 A | 8/2018 |
| KR | 10-2019-0012303 A | 2/2019 |
| KR | 10-1964768 B1 | 4/2019 |
| KR | 10-2367752 B1 | 3/2022 |

* cited by examiner

*Primary Examiner* — Carl Adams
(74) *Attorney, Agent, or Firm* — Innovation Counsel LLP

(57) ABSTRACT

Provided are a pixel in which pixel circuits of a plurality of rows of the same column share a capacitor, and a display apparatus including the same.

16 Claims, 19 Drawing Sheets

DISPLAY APPARATUS

CROSS-REFERENCE TO RELATED APPLICATION

This application is a divisional application of U.S. patent application Ser. No. 18/373,970 filed on Sep. 28, 2023, which claims priority under 35 U.S.C. § 119 to Korean Patent Application No. 10-2022-0141610, filed on Oct. 28, 2022, in the Korean Intellectual Property Office, the disclosures of which are incorporated by reference herein in their entirety by reference.

BACKGROUND

1. Field

The disclosure relates to a pixel and a display apparatus including the same.

2. Description of the Related Art

Recently, applications of display apparatuses have diversified. In addition, as display apparatuses become thinner and lighter in weight, their range of use is widening.

As display apparatuses are being used in various ways, there may be various methods for designing the shapes of display apparatuses, and functions linked to or associated with display apparatuses have increased.

SUMMARY

One or more embodiments include a display apparatus with improved display quality. However, the embodiments are only examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a first pixel circuit connected to a data line, and a second pixel circuit adjacent to the first pixel circuit and connected to the data line. Each of the first pixel circuit and the second pixel circuit includes a first transistor including a first electrode connected to a first voltage line, and including a second electrode connected to a display element, a second transistor connected between a gate electrode of the first transistor and the second electrode of the first transistor, a third transistor connected between the gate electrode of the first transistor and the second transistor and in series with the second transistor, and a first capacitor including a first electrode connected to the gate electrode of the first transistor, and including a second electrode connected to a second voltage line. The first pixel circuit and the second pixel circuit share a second capacitor including a third electrode connected to a node between the second transistor and the third transistor of each of the first pixel circuit and the second pixel circuit, and a fourth electrode connected to the data line.

In an embodiment, a gate electrode of the second transistor may be connected to the second voltage line, and a gate electrode of the third transistor may be connected to a gate line.

In an embodiment, a capacitance of the second capacitor may be greater than a capacitance of the first capacitor.

In an embodiment, a gate electrode of the second transistor may be connected to a first gate line, and a gate electrode of the third transistor may be connected to a second gate line.

In an embodiment, the display apparatus may further include a third pixel circuit adjacent to the second pixel circuit and connected to the data line. The third pixel circuit may include: a first transistor including a first electrode connected to the first voltage line, and including a second electrode connected to a display element; a second transistor connected between a gate electrode of the first transistor of the third pixel circuit and the second electrode of the first transistor of the third pixel circuit; a third transistor connected between the gate electrode of the first transistor of the third pixel circuit and the second transistor of the third pixel circuit and in series with the second transistor of the third pixel circuit; and a first capacitor including a first electrode connected to the gate electrode of the first transistor of the third pixel circuit, and including a second electrode connected to the second voltage line, and wherein the third electrode of the second capacitor may be connected to a node between the second and third transistors of the third pixel circuit.

In an embodiment, each of the first transistor, the second transistor, and the third transistor may be a P-type transistor.

According to one or more embodiments, a display apparatus includes a substrate, a first capacitor, a second capacitor, and a third capacitor. A first pixel area and a second pixel area adjacent to the first pixel area in a first direction are defined on the substrate. The first capacitor is in the first pixel area and includes a first conductive layer and a second conductive layer disposed above the first conductive layer and overlapping the first conductive layer. The second capacitor is in the second pixel area and includes a third conductive layer and a fourth conductive layer disposed above the third conductive layer and overlapping the third conductive layer. The third capacitor is in the first pixel area and the second pixel area. The third capacitor includes a fifth conductive layer extending in the first direction, positioned in the first pixel area and the second pixel area, and disposed above the second conductive layer, a sixth conductive layer extending in the first direction, positioned in the first pixel area and the second pixel area, and disposed above the fifth conductive layer and overlapping the fifth conductive layer, and a seventh conductive layer extending in the first direction, positioned in the first pixel area and the second pixel area, disposed above the sixth conductive layer and overlapping the sixth conductive layer, and connected to the fifth conductive layer.

In an embodiment, the third conductive layer of the second capacitor may be in a same layer as the first conductive layer, and the fourth conductive layer of the second capacitor may be in a same layer as the second conductive layer.

In an embodiment, the seventh conductive layer may be connected to the fifth conductive layer in each of the first pixel area and the second pixel area.

In an embodiment, further positioned in the first pixel area are a first voltage line extending in the first direction, a second voltage line extending in the first direction, a first transistor including a first electrode connected to the first voltage line, and including a second electrode connected to a display element, a second transistor connected between a gate electrode of the first transistor and the second electrode of the first transistor, and a third transistor connected between the gate electrode of the first transistor and the second transistor and in series with the second transistor.

In an embodiment, the first conductive layer of the first capacitor may be connected to the gate electrode of the first transistor, and the second conductive layer of the first capacitor may be connected to the second voltage line.

In an embodiment, the fifth conductive layer of the third capacitor may be connected to a node between the second transistor and the third transistor, and the sixth conductive layer of the third capacitor may be a data line.

In an embodiment, the gate electrode of the first transistor may be the first conductive layer of the first capacitor.

In an embodiment, the first voltage line and the second voltage line may be in a same layer as the seventh conductive layer.

In an embodiment, the display apparatus may further include a gate line extending in a second direction perpendicular to the first direction, and connected to a gate electrode of the third transistor.

In an embodiment, the gate line may be in a same layer as the second conductive layer.

In an embodiment, a gate electrode of the second transistor may be connected to the second voltage line.

In an embodiment, a groove corresponding to a portion of the fifth conductive layer may be defined in the sixth conductive layer.

In an embodiment, the first pixel area may further include a semiconductor layer including one end and an other end, the one end being connected to the first conductive layer of the first capacitor, and the other end being connected to the fifth conductive layer of the third capacitor, an eighth conductive layer overlapping between the one end and the other end of the semiconductor layer, and a ninth conductive layer connected to the eighth conductive layer and extending in a second direction perpendicular to the first direction, the eighth conductive layer may be in a same layer as the first conductive layer of the first capacitor, and the ninth conductive layer may be in a same layer as the second conductive layer of the first capacitor.

In an embodiment, the first pixel area may further include a semiconductor layer including one end and an other end, the one end being connected to a display element, and the other end being connected to the fifth conductive layer of the third capacitor, and an eighth conductive layer overlapping between the one end and the other end of the semiconductor layer and connected to the second conductive layer of the first capacitor, and the eighth conductive layer may be in a same layer as the first conductive layer of the first capacitor.

According to one or more embodiments, a display apparatus includes a data line and a plurality of pixel circuits connected to the data line. Each of the plurality of pixel circuits includes a first transistor including a first electrode connected to a first voltage line, and including a second electrode connected to a display element, a second transistor connected between a gate electrode of the first transistor and the second electrode of the first transistor, a third transistor connected between the gate electrode of the first transistor and the second transistor and in series with the second transistor, a first capacitor including a first electrode connected to the gate electrode of the first transistor, and including a second electrode connected to a second voltage line, and a second capacitor including a third electrode connected to a node between the second transistor and the third transistor, and including a fourth electrode connected to the data line. The plurality of pixel circuits include a first pixel circuit and a second pixel circuit, adjacent to each other in an extension direction of the data line, the third electrodes of the second capacitors of the first and second pixel circuits are integral, and the fourth electrodes of the second capacitors of the first and second pixel circuits are integral.

In an embodiment, the third electrode of the second capacitor may include a lower electrode disposed under the fourth electrode and an upper electrode disposed above the fourth electrode and connected to the lower electrode, the lower electrodes of the second capacitors of the first and second pixel circuits may be integral, and the upper electrodes of the second capacitors of the first and second pixel circuits may be integral.

In an embodiment, the fourth electrode of the second capacitor may be a portion of the data line.

In an embodiment, the plurality of pixel circuits may further include a third pixel circuit adjacent to the second pixel circuit in an extension direction of the data line, the third electrodes of the second capacitors of the first to third pixel circuits may be integral, and the fourth electrodes of the second capacitors of the first to third pixel circuits may be integral.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
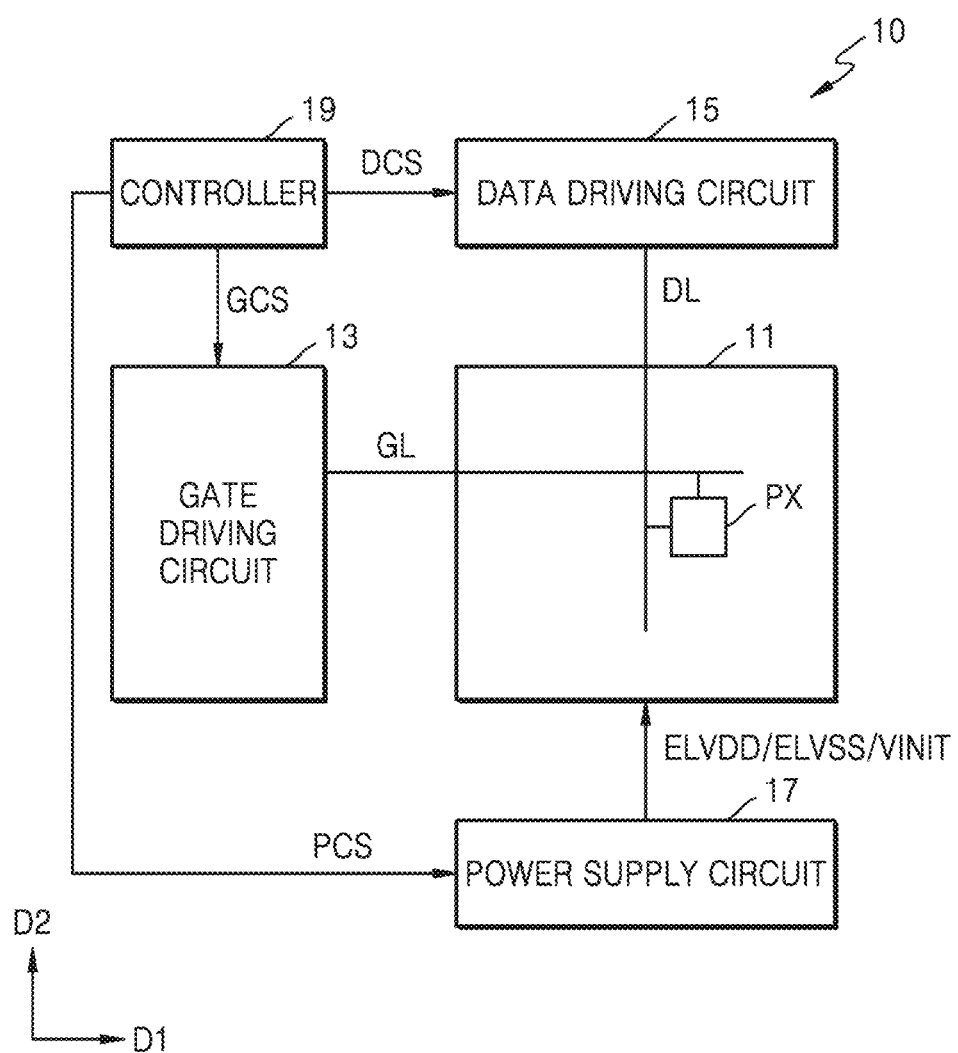
FIG. 1 is a schematic view of a display apparatus according to an embodiment.

Reference will now be made in detail to embodiments, examples of which are illustrated in the accompanying drawings, wherein like reference numerals refer to like elements throughout the present specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments of the disclosure will be illustrated in the drawings and described in the detailed description section. The effect and features of the present embodiments, and a method to achieve the same, will be clearer referring to the detailed descriptions below with the drawings. However, the disclosure may be implemented in various forms, not by being limited to the embodiments presented below.

In the following embodiment, it will be understood that although the terms "first," "second," etc. may be used herein to describe various elements, these elements should not be limited by these terms. These terms are only used to distinguish one element from another.

In the following embodiment, the expression of singularity in the specification includes the expression of plurality unless clearly specified otherwise in context.

In the following embodiment, it will be further understood that the terms "comprises" and/or "comprising" used herein specify the presence of stated features or elements, but do not preclude the presence or addition of one or more other features or elements.

In the following embodiment, it will be understood that when a layer, region, or element is referred to as being "formed on" another layer, region, or element, it can be directly or indirectly formed on the other layer, region, or element. That is, for example, intervening layers, regions, or elements may be present.

Sizes of components in the drawings may be exaggerated or reduced for convenience of explanation. For example, since sizes and thicknesses of elements in the drawings are arbitrarily illustrated for convenience of explanation, the following embodiments are not limited thereto.

In the present specification, the expression "A and/or B" represents A, B, or A and B. In addition, the expression "at least one of A and B" represents A, B, or A and B.

In the following embodiments, when X and Y are connected to each other, the connection may include an electrical connection, a functional connection, and a direct connection between X and Y. In this regard, X and Y may denote objects, for example, apparatuses, devices, circuits, wires, electrodes, terminals, conductive films, and layers. Therefore, such connections are not necessarily limited to certain connections, for example, connections in the drawings or the detailed description, and may include connections other than the aforementioned connections.

For example, when X and Y are electrically connected to each other, one or more devices, for example, switches, transistors, capacitors, inductors, resistors, and diodes, may exist between X and Y to enable the electrical connection therebetween.

In the following embodiments, the term "on" regarding a device state may refer to an active state of a device, and the term "off" may refer to an inactive state of a device. The term "on" used in relation to a signal received by a device may denote a signal for activating a device, and the term "off" may denote a signal for inactivating a device. A device may be activated according to a high-level voltage or a low-level voltage. For example, a P-channel transistor (P-type transistor) is activated according to a low-level voltage, and an N-channel transistor (N-type transistor) is activated according to a high-level voltage. Therefore, it should be construed that "on" voltages applied to the P-channel and N-channel transistors are opposite to each other, e.g., low vs. high.

FIG. 1 is a schematic view of a display apparatus 10 according to an embodiment.

The display apparatus 10 according to embodiments of the disclosure may be implemented as an electronic apparatus, such as a smart phone, a mobile phone, a smart watch, a navigation apparatus, a game machine, a television (TV), a head unit for vehicles, a laptop, a personal media player (PMP), or a personal digital assistant (PDA). In addition, the electronic apparatus may be a flexible apparatus.

Referring to FIG. 1, the display apparatus 10 may include a pixel unit 11, a gate driving circuit 13, a data driving circuit 15, a power supply circuit 17, and a controller 19.

The pixel unit 11 may include a plurality of gate lines GL, a plurality of data lines DL, and a plurality of pixels PX connected thereto.

The plurality of pixels PX may be arranged in various forms, such as a stripe arrangement, a pentile arrangement (diamond arrangement), or a mosaic arrangement, to implement an image. The pixel unit 11 may be arranged in a display area of a substrate. Each of the pixels PX may include an organic light-emitting device OLED as a display element (light-emitting element), and the organic light-emitting device OLED may be connected to a pixel circuit. The pixel circuit may include a plurality of transistors and at least one capacitor.

Each of the pixels PX may emit, for example, red light, green light, blue light, or white light via the organic light-emitting device OLED. Each of the pixels PX may be connected to at least one corresponding gate line among the plurality of gate lines GL and a corresponding data line among the plurality of data lines DL.

Each of the gate lines GL may extend in a first direction D1, for example, an x direction, a row direction, and may be connected to the pixels PX located in the same row. Each of the gate lines GL may be configured to transfer a gate signal to the pixels PX in the same row. Each of the data lines DL may extend in a second direction D2, for example, a y direction, a column direction, and may be connected to the pixels PX located in the same column. Each of the data lines DL may be configured to transfer data signals to the pixels PX in the same column.

The gate driving circuit 13 may be connected to the plurality of gate lines GL and may be configured to generate a gate signal in response to a control signal GCS from the controller 19 and sequentially supply the gate signal to the gate lines GL. The gate line GL may be connected to a gate of a transistor included in the pixel PX. The gate signal may be a gate control signal for controlling turn-on and turn-off of a transistor whose gate is connected to the gate line GL. The gate signal may be a square wave signal including an on voltage at which a transistor may be turned on and an off voltage at which a transistor may be turned off. In an embodiment, the on voltage may be a high-level voltage (first level voltage) or a low-level voltage (second level voltage). A period (hereinafter, referred to as an "on voltage period") during which the on voltage of the gate signal is maintained and a period (hereinafter, referred to as an "off voltage period") during which the off voltage is maintained may be determined according to a function of a transistor configured to receive a scan signal within the pixel PX.

The data driving circuit 15 may be connected the plurality of data lines DL and may be configured to supply data signals to data lines DL in response to a control signal DCS from the controller 19. The data signals supplied to each of the data lines DL may be supplied to the pixels PX to which the gate signal is supplied.

The power supply circuit 17 may be configured to generate voltages necessary for driving the pixel PX in response to a control signal PCS from the controller 19. When the display apparatus 10 is an organic electroluminescent display apparatus, the power supply circuit 17 may be configured to supply a first driving voltage ELVDD and a second driving voltage ELVSS to the pixels PX of the pixel unit 11. The first driving voltage ELVDD may be a high-level voltage provided to a first electrode, e.g., a pixel electrode or an anode electrode, of the display element included in the pixel PX. The second driving voltage ELVSS may be a low-level voltage provided to a second electrode, e.g., an opposite electrode or a cathode electrode, of the display element included in the pixel PX.

The controller 19 may generate the control signals GCS, DCS, and PCS based on signals input from the outside, and may supply the control signals GCS, DCS, and PCS to the gate driving circuit 13, the data driving circuit 15, and the power supply circuit 17, respectively. The control signal GCS output to the gate driving circuit 13 may include a plurality of clock signals and a scan start signal. The control signal DCS output to the data driving circuit 15 may include a source start signal and clock signals.

The display apparatus 10 may include a display panel, and the display panel may include a substrate. The display apparatus 10 may include a display area for displaying an image and a peripheral area surrounding the display area and located outside the display area. The pixel unit 11 is arranged in the display area of the substrate, and external circuits, such as the gate driving circuit 13, the data driving circuit 15, and the power supply circuit 17, may be arranged in the peripheral area. For example, a portion or all of the gate driving circuit 13 may be directly formed in the peripheral area of the substrate during a process of forming a transistor constituting a pixel circuit in the display area of the substrate. The data driving circuit 15 may be disposed on a flexible printed circuit board (FPCB) electrically connected to a pad arranged on one side of the substrate. In an embodiment, the data driving circuit 15 may be directly disposed on the substrate by using a chip on glass (COG) or chip on plastic (COP) method.

Figure 2:
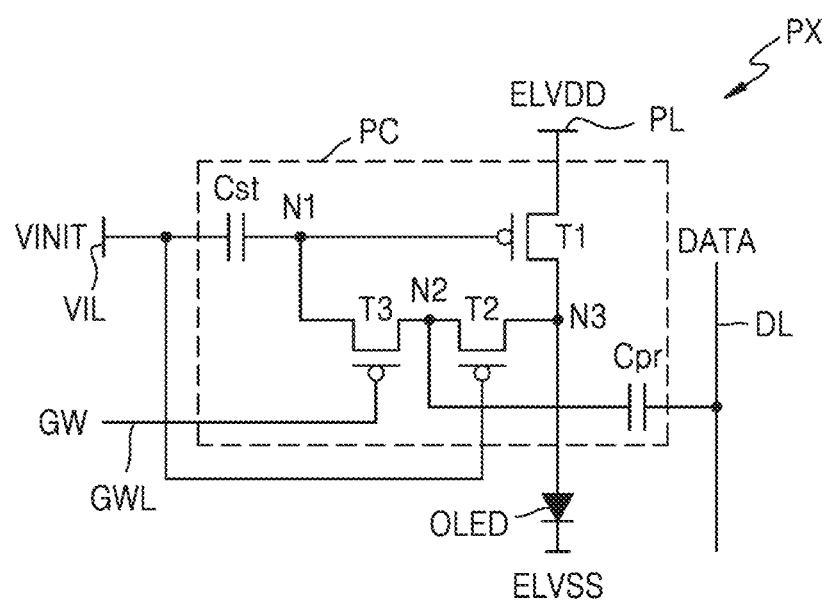
FIG. 2 is a circuit diagram of a pixel according to an embodiment.
Figure 3:
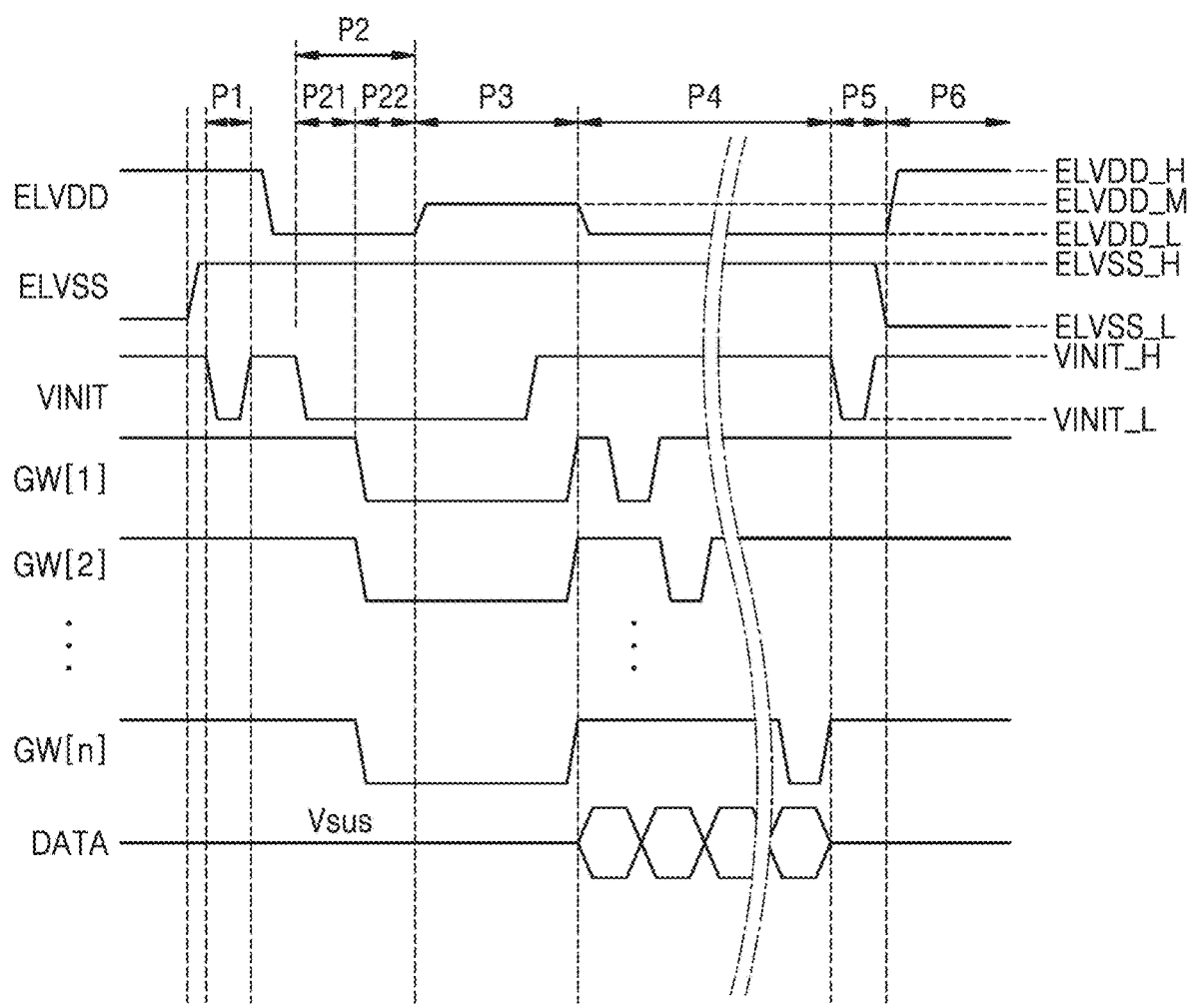
FIG. 3 is a timing diagram for describing driving of the pixel of FIG. 2.

FIG. 2 is a circuit diagram of a pixel PX according to an embodiment. FIG. 3 is a timing diagram for describing driving of the pixel PX of FIG. 2.

Referring to FIG. 2, the pixel PX may include a pixel circuit PC and the organic light-emitting device OLED as a display element connected to the pixel circuit PC. The pixel circuit PC may include a first transistor T1, a second transistor T2, a third transistor T3, a first capacitor Cst, and a second capacitor Cpr, which are connected to a plurality of signal lines. The signal lines may include a data line DL, a gate line GWL, and an initialization voltage line VIL, and a driving voltage line PL. The gate line GWL may be a gate control line to which a gate signal for controlling turn-on and turn-off of a transistor is applied.

In an embodiment, the first transistor T1, the second transistor T2, and the third transistor T3 included in the pixel circuit PC may be P-type silicon thin-film transistors. A silicon thin-film transistor may be a low temperature polysilicon (LTPS) thin-film transistor in which an active pattern, e.g., a semiconductor layer, includes amorphous silicon or poly silicon.

The first transistor T1 may be a driving transistor, and the second transistor T2 and the third transistor T3 may be switching transistors. A first terminal, e.g., a first electrode, of each of the first to third transistors T1 to T3 may be a source or a drain, and a second terminal, e.g., a second electrode, thereof may be different from the first terminal. For example, when the first terminal is a source, e.g., a source electrode, the second terminal may be a drain, e.g., a drain electrode. In an embodiment, the source and the drain may be interchangeably referred to as the source electrode and the drain electrode, respectively. A node to which a gate of the first transistor T1 is connected may be defined as a first node N1, a node to which a second terminal of the second transistor T2 and a first terminal of the third transistor T3 are connected may be defined as a second node N2, and a node to which a second terminal of the first transistor T1 is connected may be defined as a third node N3.

The first transistor T1 may be connected between the driving voltage line PL and the organic light-emitting device OLED. The first transistor T1 may include a gate, e.g., a gate electrode, connected to the first node N1, a first terminal connected to the driving voltage line PL, and a second terminal connected to the third node N3.

The second transistor T2 may be connected between the third node N3 and the second node N2. The second transistor T2 may include a gate connected to the initialization voltage line VIL, a first terminal connected to the third node N3, and a second terminal connected to the second node N2.

The third transistor T3 may be connected with the second transistor T2 in series. The third transistor T3 may be connected between the second node N2 and the first node N1. The third transistor T3 may include a gate connected to the gate line GWL, a first terminal connected to the second node N2, and a second terminal connected to the first node N1.

The first capacitor Cst may be connected between the first node N1 and the initialization voltage line VIL. The first capacitor Cst may include a first electrode connected to the first node N1 and a second electrode connected to the initialization voltage line VIL.

The second capacitor Cpr may be connected between the data line DL and the second node N2. The second capacitor Cpr may include a first electrode connected to the data line DL and a second electrode connected to the second node N2. A capacitance of the second capacitor Cpr may be greater than a capacitance of the first capacitor Cst.

The organic light-emitting device OLED may include a pixel electrode connected to the third node N3 and an opposite electrode, and the opposite electrode may receive the second driving voltage ELVSS.

The pixel PX may display an image for each frame period. Referring to FIG. 3, one frame period may include a bias period P1, an initialization period P2, a compensation period P3, a writing period P4, a bypass period P5, and an emission period P6. The pixels PX may be simultaneously driven during the bias period P1, the initialization period P2, the compensation period P3, the bypass period P5, and the emission period P6, and the pixels PX may be sequentially driven in units of row during the writing period P4.

Each of the first driving voltage ELVDD supplied to the driving voltage line PL, an initialization voltage VINIT supplied to the initialization voltage line VIL, and the second driving voltage ELVSS supplied to the opposite electrode may have a voltage level varying within one frame period. For example, the first driving voltage ELVDD may have one of a first voltage ELVDD_L, a second voltage ELVDD_H having a voltage level greater than the first voltage ELVDD_L, and a third voltage ELVDD_M between the first voltage ELVDD_L and the second voltage ELVDD_H. The second driving voltage ELVSS may have one of a fourth voltage ELVSS_L and a fifth voltage ELVSS_H having a voltage level greater than the fourth voltage ELVSS_L. The initialization voltage VINIT may have one of a sixth voltage VINIT_L and a seventh voltage VINIT_H having a voltage level greater than the sixth voltage VINIT_L.

The first voltage ELVDD_L may be the same as the fourth voltage ELVSS_L. The second voltage ELVDD_H may be the same as the fifth voltage ELVSS_H. The sixth voltage VINIT_L may have a lower voltage level than that of each of the first voltage ELVDD_L and the fourth voltage ELVSS_L. The seventh voltage VINIT_H may have a greater voltage level than that of each of the first voltage ELVDD_L and the fourth voltage ELVSS_L, and may have a lower voltage level than that of each of the second voltage ELVDD_H and the fifth voltage ELVSS_H.

A sustain voltage Vsus may be applied to the data line DL outside the writing period P4, and the data signal DATA for gray scale expression may be supplied to the data line DL in the writing period P4.

In the bias period P1, the first driving voltage ELVDD may have the second voltage ELVDD_H, the second driving voltage ELVSS may have the fifth voltage ELVSS_H, the initialization voltage VINIT may have the sixth voltage VINIT_L, and a gate signal GW may have an off voltage. The second transistor T2 may be turned on by the initialization voltage VINIT of low voltage, and the third transistor T3 may be turned off by the gate signal GW of the off voltage. A gate voltage of the first transistor T1 may drop due to a coupling action of the first capacitor Cst, and accordingly, the first transistor T1 may be turned on. At this time, the second driving voltage ELVSS is a high voltage, and thus the organic light-emitting device OLED may be in a non-emission state. In the bias period P1, hysteresis characteristics of the first transistor T1 may be improved due to application of an on-bias to the gate of the first transistor T1.

The initialization period P2 may include a first initialization period P21 and a second initialization period P22.

In the first initialization period P21, the first driving voltage ELVDD may have the first voltage ELVDD_L, the second driving voltage ELVSS may have the fifth voltage ELVSS_H, the initialization voltage VINIT may have the sixth voltage VINIT_L, and the gate signal GW may have an off voltage. The second transistor T2 may be turned on by the initialization voltage VINIT of low voltage, and the third transistor T3 may be turned off by the gate signal GW of the off voltage. A gate voltage of the first transistor T1 may drop due to a coupling action of the first capacitor Cst, and the first transistor T1 may be turned on. The organic light-emitting device OLED is reverse biased by the first driving voltage ELVDD of low voltage and the second driving voltage ELVSS of high voltage, and the organic light-emitting device OLED is discharged, such that the pixel electrode may be initialized.

In the second initialization period P22, the first driving voltage ELVDD may have the first voltage ELVDD_L, the second driving voltage ELVSS may have the fifth voltage ELVSS_H, the initialization voltage VINIT may have the sixth voltage VINIT_L, and the gate signal GW may have an on voltage. By the turned on first transistor T1, second transistor T2, and third transistor T3, the first transistor T1 is diode-connected, and the first node N1 is set to a voltage (Vg=ELVDD_L−Vth) obtained by subtracting a threshold voltage Vth of the first transistor T1 from the first voltage ELVDD_L, such that the gate of the first transistor T1 may be initialized.

In the compensation period P3, the first driving voltage ELVDD may have the third voltage ELVDD_M, the second driving voltage ELVSS may have the fifth voltage ELVSS_H, the initialization voltage VINIT may have the sixth voltage VINIT_L, and the gate signal GW may have an on voltage. The second transistor T2 may be turned on by the initialization voltage VINIT of low voltage, and the third transistor T3 may be turned on by the gate signal GW of the on voltage. By the turned on first transistor T1, second transistor T2, and third transistor T3, the first transistor T1 may maintain a diode connection, and the gate of the first transistor T1 may have a voltage (Vg=ELVDD_M−Vth) obtained by compensating for the threshold voltage Vth of the first transistor T1 at the third voltage ELVDD_M.

In the writing period P4, the first driving voltage ELVDD may have the first voltage ELVDD_L, the second driving voltage ELVSS may have the fifth voltage ELVSS_H, the initialization voltage VINIT may have the seventh voltage VINIT_H, gate signals GW[1] to GW[n] of an on voltage may be sequentially applied to gate lines GWL from a first row to an $n^{th}$ row (where, n may be a natural number greater than 0), and data signals DATA may be applied to the data lines DL in synchronization with the gate signals GW[1] to GW[n]. The second transistor T2 may be turned off by the initialization voltage VINIT of high voltage, and the third transistor T3 may be turned on by the gate signal GW of the on voltage. Accordingly, the first capacitor Cst and the second capacitor Cpr are connected in series, and charge sharing may occur between the first capacitor Cst and the second capacitor Cpr. Accordingly, the gate of the first transistor T1 may have a voltage (i.e., Vg=ELVDD_H−Vth+α×ΔVdata, ΔVdata=Vdata−Vsus, wherein Vdata is a voltage corresponding to the data signal DATA) proportional to a capacitance ratio (α=Cpr/(Cpr+Cst)) of the first capacitor Cst and the second capacitor Cpr.

In the bypass period P5, the first driving voltage ELVDD may have the first voltage ELVDD_L, the second driving voltage ELVSS may have the fifth voltage ELVSS_H, the initialization voltage VINIT may have the sixth voltage VINIT_L, and the gate signal GW may have an off voltage. The second transistor T2 may be turned on by the initialization voltage VINIT of low voltage, and the third transistor T3 may be turned off by the gate signal GW of the off voltage. A gate voltage of the first transistor T1 may drop due to a coupling action of the first capacitor Cst, and the first transistor T1 may be turned on. The organic light-emitting device OLED is reverse biased by the first driving voltage ELVDD of low voltage and the second driving voltage ELVSS of high voltage, and the organic light-emitting device OLED is discharged, such that the pixel electrode may be initialized.

In the emission period P6, the first driving voltage ELVDD may have the second voltage ELVDD_H, the second driving voltage ELVSS may have the fourth voltage ELVSS_L, the initialization voltage VINIT may have the seventh voltage VINIT_H, and the gate signal GW may have an off voltage. The second transistor T2 may be turned off by the initialization voltage VINIT of high voltage, and the third transistor T3 may be turned off by the gate signal GW of the off voltage. The first transistor T1 outputs a driving current according to a gate-source voltage difference of the first transistor T1, and the driving current flows to the organic light-emitting device OLED, such that the pixel PX may emit light. In the emission period P6, all pixels PX may simultaneously emit light.

In the case of simultaneous emission driving, since the data signal DATA is written in units of rows during the writing period P4, a writing time varies according to the rows, and after data writing is completed, a voltage stored in the first capacitor Cst may vary or leakage current occurs in the first transistor T1 until all pixels PX simultaneously emit light, such that a voltage of the pixel electrode of the organic light-emitting device OLED may vary. Therefore, the variation in voltage of the pixel electrode of the organic light-emitting device OLED may be prevented by discharging the organic light-emitting device OLED immediately before the pixels PX emit light.

Figure 4:
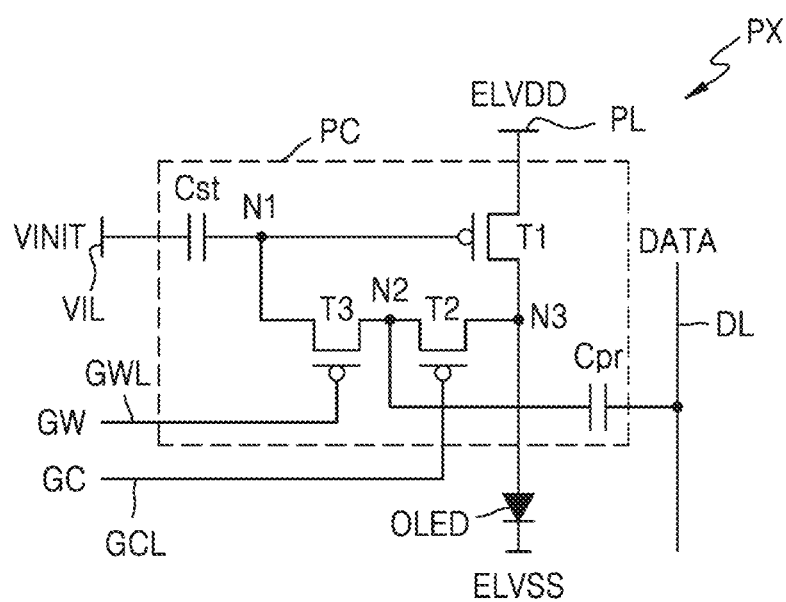
FIG. 4 is a circuit diagram of a pixel according to an embodiment.
Figure 5:
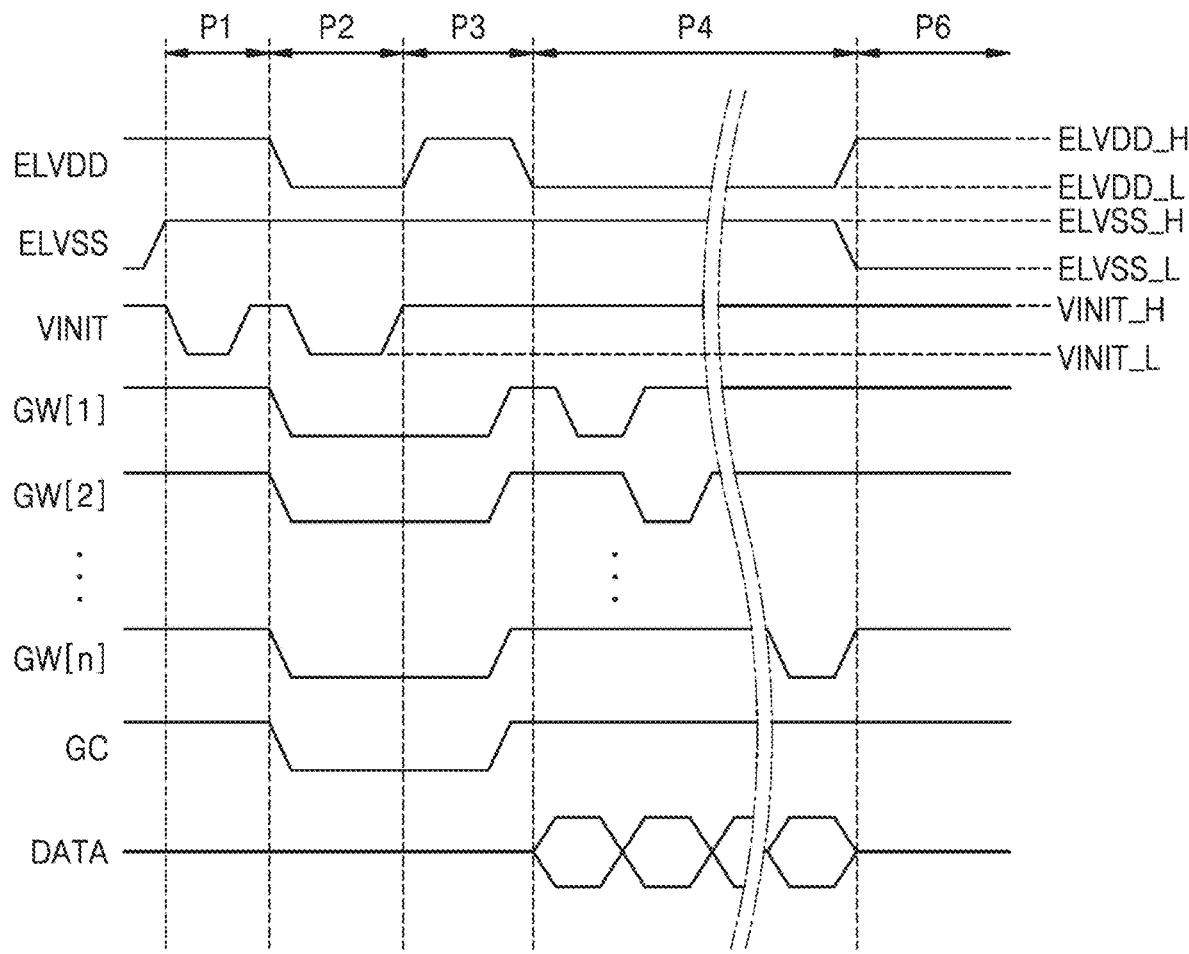
FIG. 5 is a timing diagram for describing driving of the pixel of FIG. 4.

FIG. 4 is a circuit diagram of a pixel PX according to an embodiment. FIG. 5 is a timing diagram for describing driving of the pixel PX of FIG. 4. Hereinafter, differences from FIGS. 2 and 3 will be mainly described.

The pixel PX shown in FIG. 4 differs from the pixel PX shown in FIG. 2 in that the gate of the second transistor T2 is connected to a second gate line GCL to which a second gate signal GC is supplied. In addition, circuit elements of the pixel PX shown in FIG. 4 and their connection relationship are the same as those of the pixel PX shown in FIG. 2, and thus descriptions thereof will be omitted.

Referring to FIG. 5, one frame period may include the bias period P1, the initialization period P2, the compensation period P3, the writing period P4, and the emission period P6.

In the bias period P1, hysteresis characteristics of the first transistor T1 may be improved due to application of an on-bias to the gate of the first transistor T1.

In the initialization period P2, the first driving voltage ELVDD may have the first voltage ELVDD_L, the second driving voltage ELVSS may have the fifth voltage ELVSS_H, the initialization voltage VINIT may have the sixth voltage VINIT_L, and the gate signal GW may have an on voltage. By the turned on first transistor T1, second transistor T2, and third transistor T3, the first transistor T1 is diode-connected, and the first node N1 is set to a voltage (Vg=ELVDD_L−Vth) obtained by subtracting the threshold voltage Vth of the first transistor T1 from the first voltage ELVDD_L, such that the gate of the first transistor T1 may be initialized.

In the compensation period P3, the first driving voltage ELVDD may have the second voltage ELVDD_H, the second driving voltage ELVSS may have the fifth voltage ELVSS_H, the initialization voltage VINIT may have the seventh voltage VINIT_H, and the gate signal GW may have an on voltage. By the turned on first transistor T1, second transistor T2, and third transistor T3, the first transistor T1 maintains a diode connection, and the gate of the first transistor T1 may have a voltage (Vg=ELVDD_H−Vth) obtained by compensating for the threshold voltage Vth of the first transistor T1 at the second voltage ELVDD_H.

In the writing period P4, the first capacitor Cst and the second capacitor Cpr are connected in series, and charge sharing may occur between the first capacitor Cst and the second capacitor Cpr. Accordingly, the gate of the first transistor T1 may have a voltage (i.e., Vg=ELVDD_H−Vth+α×ΔVdata, ΔVdata=Vdata−Vsus, wherein Vdata is a voltage corresponding to the data signal DATA) proportional to a capacitance ratio (α=Cpr/(Cpr+Cst)) of the first capacitor Cst and the second capacitor Cpr.

In the emission period P6, the first transistor T1 outputs a driving current according to a gate-source voltage difference of the first transistor T1, the driving current flow to the organic light-emitting device OLED, and all pixels PX may simultaneously emit light.

In FIG. 5, the bypass period P5 of FIG. 3 is omitted, but in an embodiment, the bypass period P5 of FIG. 3 may be added.

Figure 6:
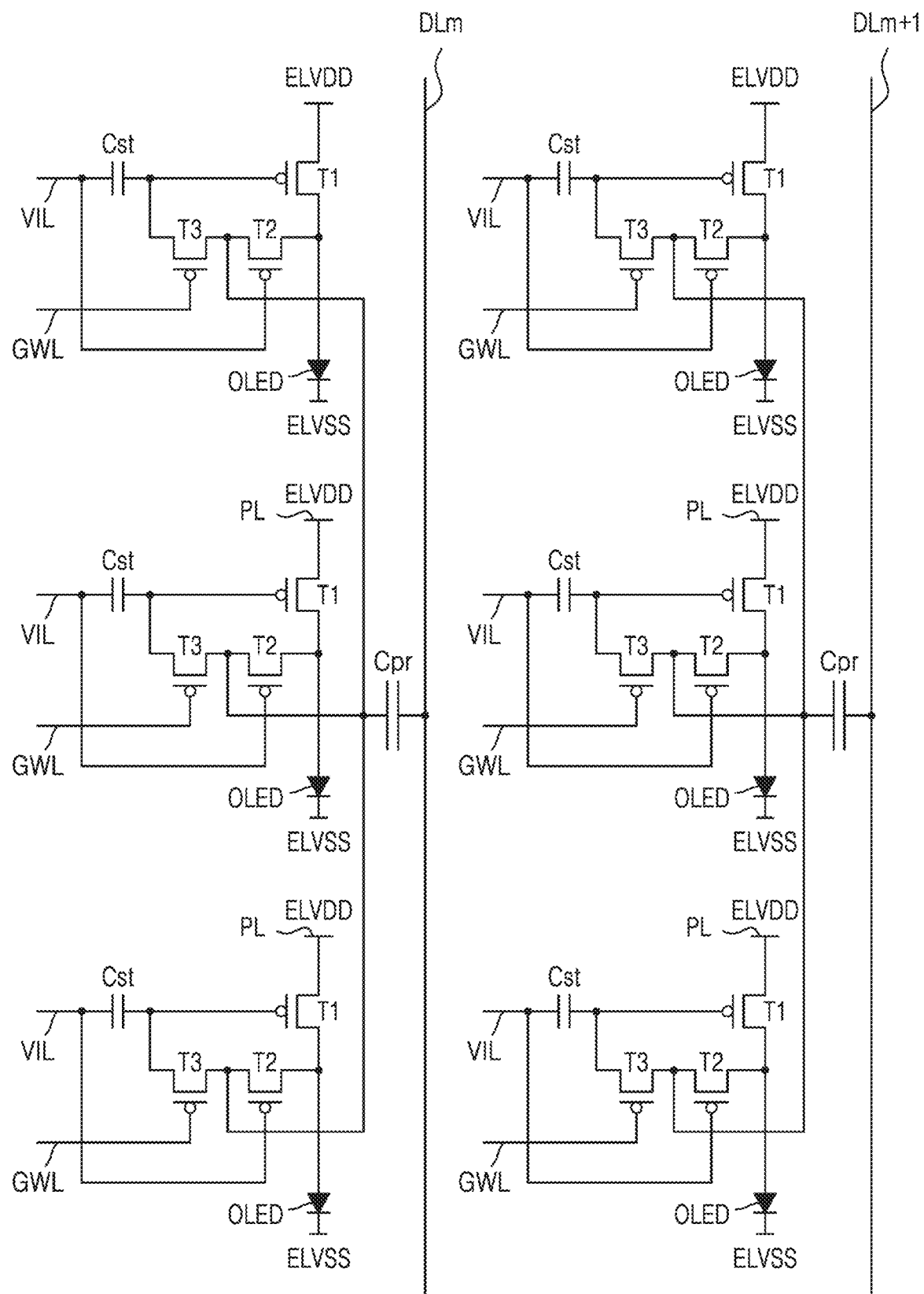
FIG. 6 is a schematic view of pixels sharing a second capacitor, according to an embodiment.

FIG. 6 is a schematic view of pixels sharing a second capacitor Cpr, according to an embodiment.

A voltage proportional to a capacitance ratio (α=Cpr/(Cpr+Cst)) of the first capacitor Cst and the second capacitor Cpr may be written in the pixels PX shown in FIGS. 2 and 4. Accordingly, a luminance difference may occur due to capacitance distribution (capacitance difference) of the second capacitors Cpr in a display panel. As a capacitance of the second capacitor Cpr increases, the capacitance distribution may be improved.

In an embodiment, since the pixels PX in a plurality of rows share the second capacitor Cpr, a capacitance of the second capacitor Cpr may be large in a high-resolution display apparatus to improve capacitance distribution. The number of rows sharing the second capacitor Cpr may be at least two depending on the first driving voltage ELVDD and a structure of a panel.

In an embodiment, the pixels PX in three rows may share the second capacitor Cpr. FIG. 6 illustrates an example where the pixels PX of three rows connected to an $m^{th}$ data line DLm of an $m^{th}$ column share the second capacitor Cpr, and the pixels of three rows connected to an $m+1^{th}$ data line DLm+1 of an $m+1^{th}$ column share the second capacitor Cpr, where m is a natural number greater than 0.

Figure 14:
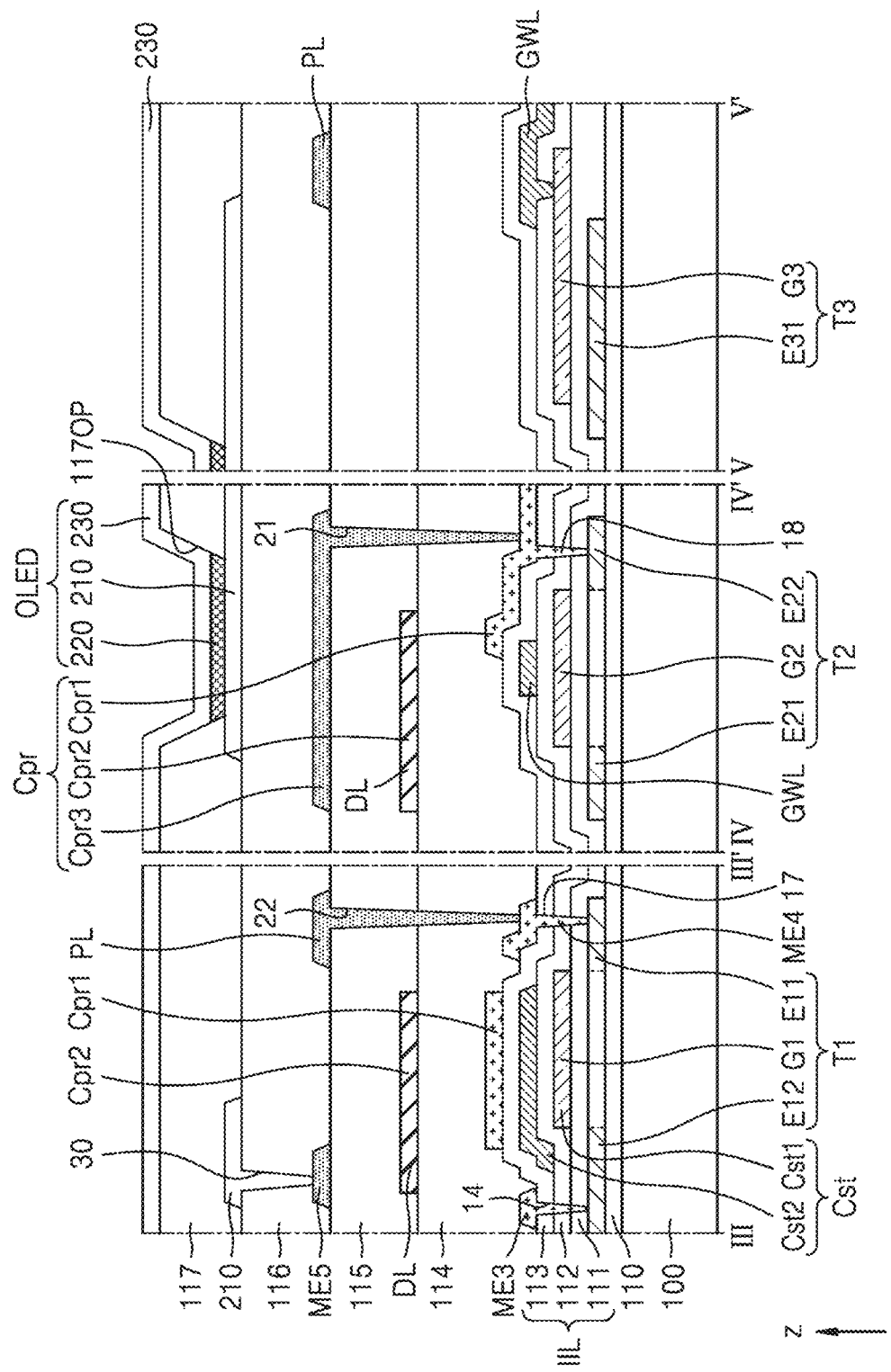
FIG. 14 is a cross-sectional view of the pixel taken along lines III-III', IV-IV', and V-V' of FIG. 13.

FIGS. 7 to 13 are schematic layout diagrams of elements of the pixel PX shown in FIG. 2 for each layer. FIG. 14 is a cross-sectional view of the pixel taken along lines III-III', IV-IV', and V-V' of FIG. 13.

Unlike the pixel PX shown in FIG. 4, the pixel PX shown in FIG. 2 does not include the second gate line GCL, and accordingly, an area of a pixel area in which the pixel circuit of the pixel PX of FIG. 2 is arranged may be reduced compared to an area of a pixel area of the pixel PX of FIG. 4, such that a high-resolution display apparatus may be implemented.

A display area may include a plurality of pixel areas in which rows and columns intersect. A pixel area may be where a pixel circuit is arranged. The pixel area may include a pair of a first pixel area PXA1 and a second pixel area PXA2 adjacent to each other in an x direction.

A pixel circuit arranged in the first pixel area PXA1 and a pixel circuit arranged in the second pixel area PXA2 may be line symmetric with respect to a virtual boundary line VBL. The same elements are arranged in each layer of the first pixel area PXA1 and the second pixel area PXA2, and thus, for convenience of explanation, elements of the pixel circuit arranged in the first pixel area PXA1 will be mainly described. Hereinafter, descriptions will be made with reference to FIGS. 4 to 14.

A substrate 100 may include a glass material, a ceramic material, a metal material, or a flexible or bendable material. The substrate 100 may have a single-layer structure of an organic layer or a multilayer structure of an organic layer and an inorganic layer. For example, the substrate 100 may have a structure of a stack of a first base layer/barrier layer/second base layer. Each of the first base layer and the second base layer may be an organic layer including polymer resin. Each of the first base layer and the second base layer may include transparent polymer resin. The barrier layer prevents penetration of foreign substances, and may be a single layer or multilayer including an inorganic material, such as silicon nitride ($SiN_x$) or silicon oxide ($SiO_x$).

Figure 7:
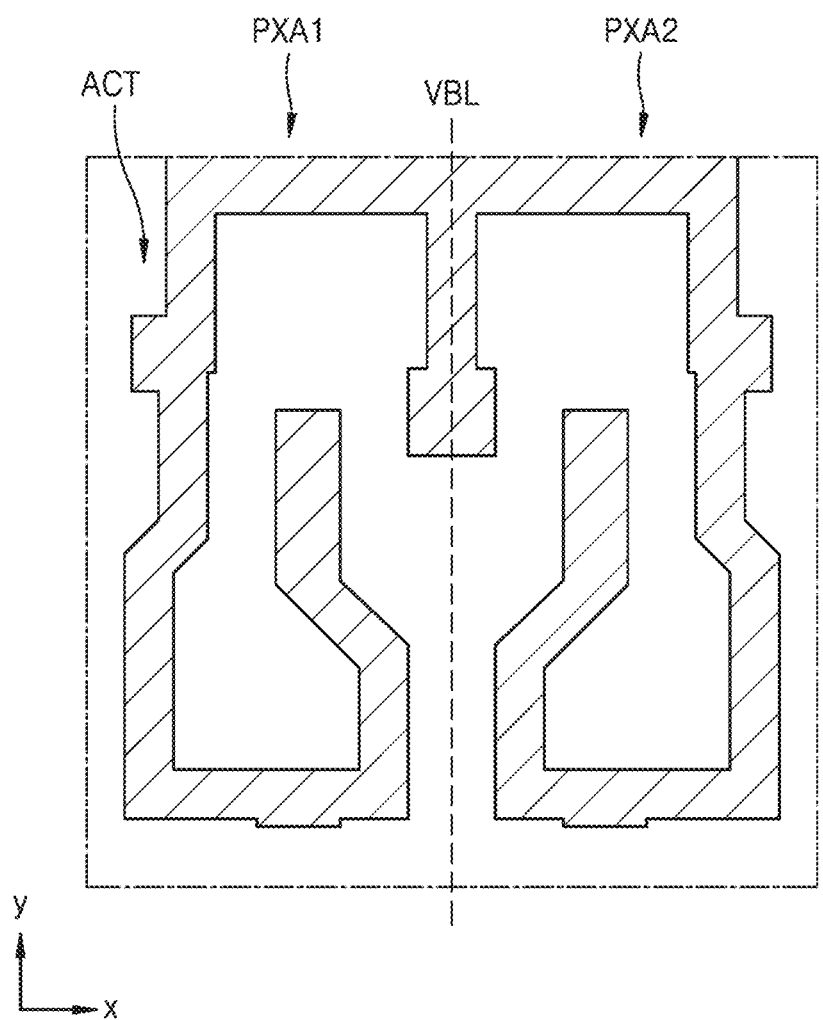
FIGS. 7, 8, 9, 10, 11, 12, and 13 are schematic layout diagrams of elements of the pixel shown in FIG. 2 for each layer.

A buffer layer 110 may be disposed on the substrate 100, and a semiconductor layer ACT as shown in FIG. 7 may be disposed on the buffer layer 110. The semiconductor layer ACT may include amorphous silicon, polycrystalline silicon, or an inorganic semiconductor material, such as oxide semiconductor. The semiconductor layer ACT of the first pixel area PXA1 and the semiconductor layer ACT of the second pixel area PXA2 may be connected to each other.

Figure 8:
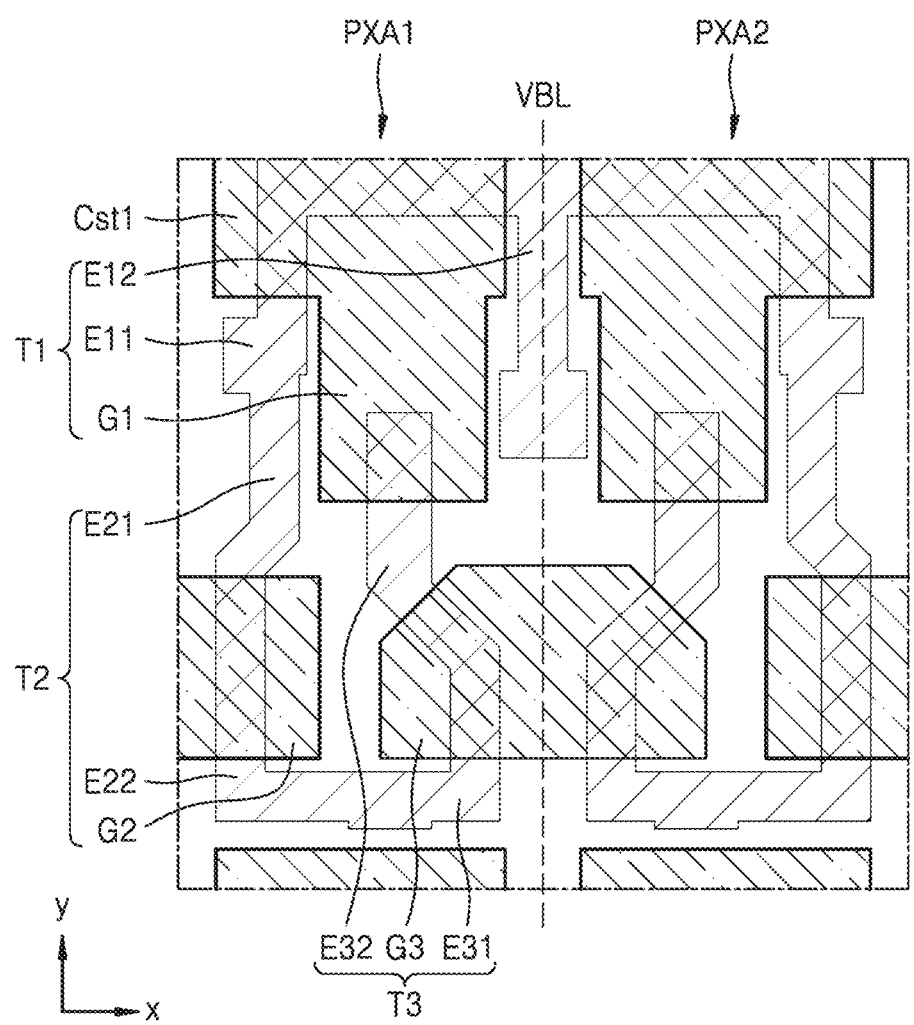

Referring to FIG. 8, the semiconductor layer ACT of each pixel area may include a source area E11 and drain area E12 of the first transistor T1, a source area E21 and drain area E22 of the second transistor T2, and a source area E31 and drain area E32 of the third transistor T3. The semiconductor layer ACT may include a channel area between the source areas E11 to E31 and the drain areas E12 to E32 of each of the first to third transistors T1 to T3, respectively. In an embodiment, the source area and the drain area may be a source electrode and a drain electrode, respectively.

A first insulating layer 111 may be disposed above the semiconductor layer ACT, and a first conductive layer may be disposed on the first insulating layer 111. As shown in FIG. 8, the first conductive layer may include gate electrodes G1 to G3 of the first to third transistors T1 to T3. The gate electrodes G1 to G3 of the first to third transistors T1 to T3 may overlap the channel areas of the semiconductor layer ACT. The gate electrode G1 of the first transistor T1 may overlap a portion of the drain area E32 of the third transistor T3.

Each of the gate electrodes G1 to G3 of the first to third transistors T1 to T3 may be provided in an island type. The gate electrode G1 of the first transistor T1 may be provided in each pixel area. The gate electrode G1 of the first transistor T1 may be a first electrode Cst1 which is a lower electrode of the first capacitor Cst. The gate electrode G2 of the second transistor T2 of the first pixel area PXA1 and the gate electrode G2 of the second transistor T2 of the second pixel area PXA2 may be connected to each other. The gate electrode G3 of the third transistor T3 of the first pixel area PXA1 and the gate electrode G3 of the third transistor T3 of the second pixel area PXA2 may be connected to each other.

Figure 9:
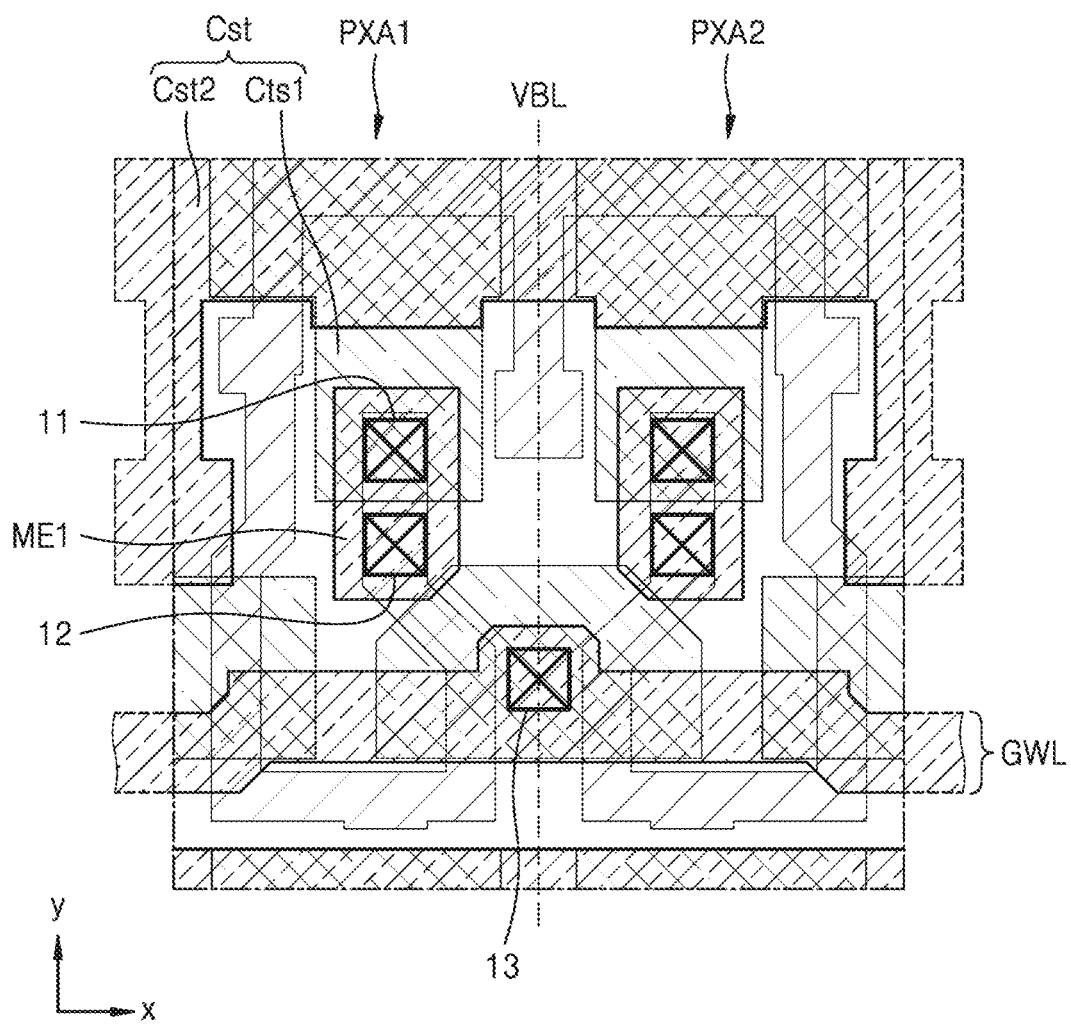

A second insulating layer 112 may be disposed above the first insulating layer 111 while covering the first conductive layer, and a second conductive layer may be disposed on the second insulating layer 112. As shown in FIG. 9, the second conductive layer may include a second electrode Cst2 which is an upper electrode of the first capacitor Cst, the gate line GWL, and a conductive pattern ME1.

The second electrode Cst2 of the first capacitor Cst may cover the first electrode Cst1 of the first capacitor Cst. The first capacitor Cst may overlap the first transistor T1. The second electrode Cst2 of the first capacitor Cst of the first pixel area PXA1 and the second electrode Cst2 of the first capacitor Cst of the second pixel area PXA2 may be connected to each other.

The gate line GWL may be electrically connected to the gate electrode G3 of the third transistor T3 through a contact hole 13 of the second insulating layer 112.

The conductive pattern ME1 may be electrically connected to the gate electrode G1 of the first transistor T1 through a contact hole 11 of the second insulating layer 112 and may be electrically connected to the drain area E32 of the third transistor T3 through a contact hole 12 of first insulating layer 111 and the second insulating layer 112.

Figure 10:
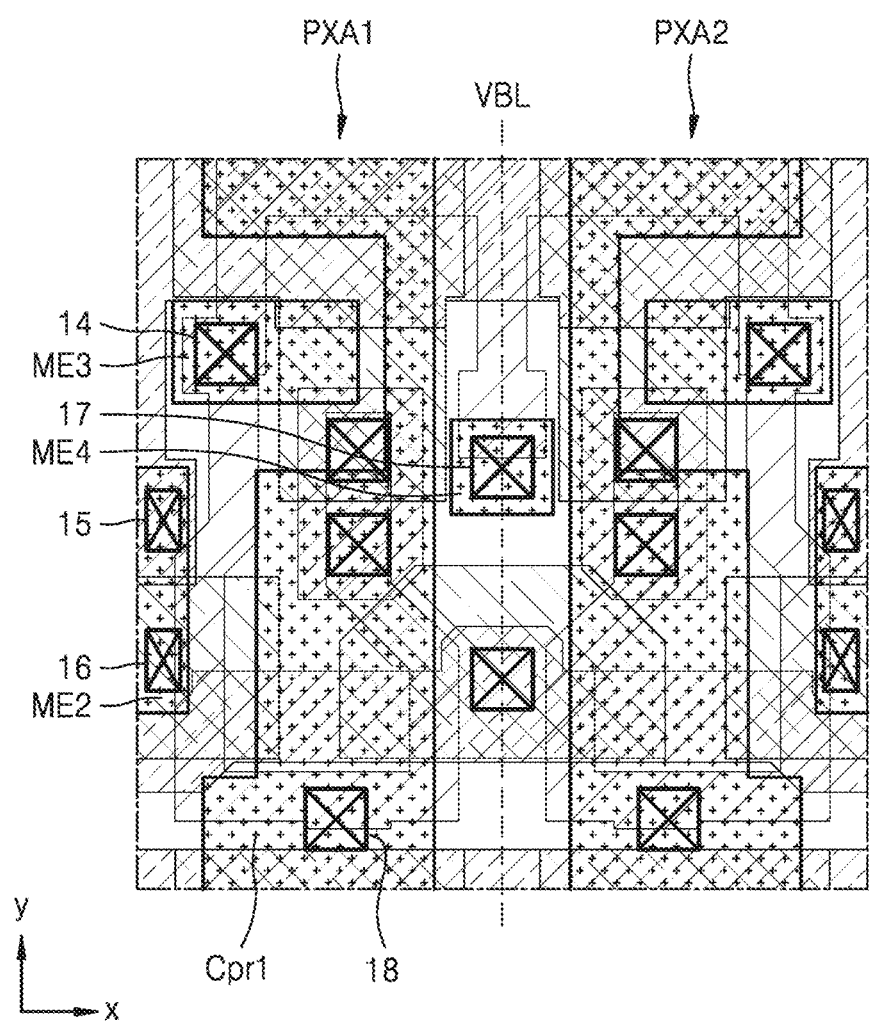

A third insulating layer 113 may be disposed above the second insulating layer 112 while covering the second conductive layer, and a third conductive layer may be disposed on the third insulating layer 113. As shown in FIG. 10, the third conductive layer may include a lower electrode Cpr1 of the first electrode of the second capacitor Cpr and conductive patterns ME2, ME3, and ME4.

The lower electrode Cpr1 of the second capacitor Cpr may extend in a y direction. The lower electrode Cpr1 of the second capacitor Cpr may be connected to the lower electrode Cpr1 of the second capacitor Cpr of at least one pixel area among pixel areas adjacent to each other in the y direction. The lower electrode Cpr1 of the second capacitor Cpr may be integrally formed with the lower electrode Cpr1 of the second capacitor Cpr of at least one pixel area among pixel areas adjacent to each other in the y direction. The lower electrode Cpr1 of the second capacitor Cpr may be electrically connected to the drain area E22 of the second transistor T2 and the source area E31 of the third transistor T3 through a contact hole 18 of the first insulating layer 111, the second insulating layer 112, and the third insulating layer 113.

The conductive pattern ME2 may be electrically connected to the gate electrode G2 of the second transistor T2 through a contact hole 16 of the second insulating layer 112 and the third insulating layer 113 and may be electrically connected to the second electrode Cst2 of the first capacitor Cst through a contact hole 15 of the third insulating layer 113.

The conductive pattern ME3 may be electrically connected to the drain area E12 of the first transistor T1 through a contact hole 14 of the first insulating layer 111, the second insulating layer 112, and the third insulating layer 113.

The conductive pattern ME4 may be electrically connected to the source area E11 of the first transistor T1 through a contact hole 17 of the first insulating layer 111, the second insulating layer 112, and the third insulating layer 113. The conductive pattern ME4 may be shared by the pixel circuit of the first pixel area PXA1 and the pixel circuit of the second pixel area PXA2.

Figure 11:
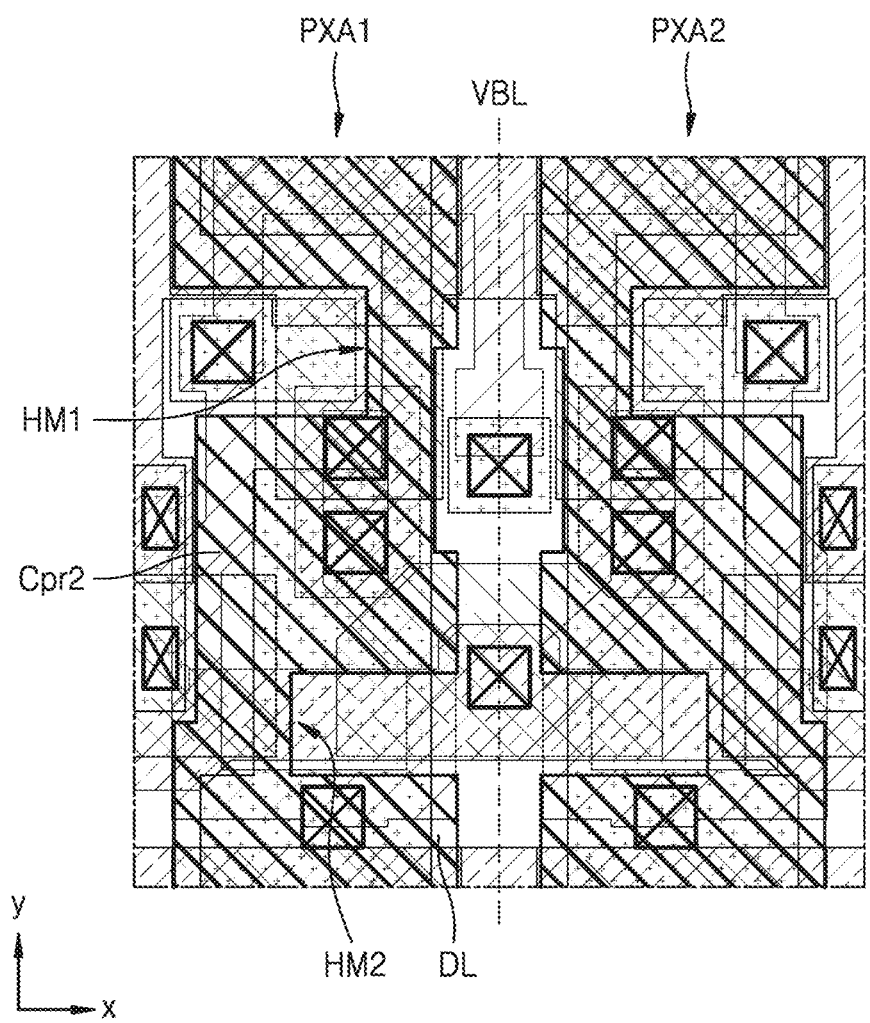

A fourth insulating layer 114 may be disposed above the third insulating layer 113 while covering the third conductive layer, and a fourth conductive layer may be disposed on the fourth insulating layer 114. As shown in FIG. 11, the fourth conductive layer may include a second electrode Cpr2 of the second capacitor Cpr.

The second electrode Cpr2 of the second capacitor Cpr may extend in the y direction and may overlap the lower electrode Cpr1 of the second capacitor Cpr. The second electrode Cpr2 of the second capacitor Cpr may be the data line DL. A groove HM1 corresponding to the conductive pattern ME3 and a groove HM2 corresponding to a portion of the lower electrode Cpr1 of the second capacitor Cpr may be defined in the second electrode Cpr2 of the second capacitor Cpr. The grooves HM1 and HM2 may be recessed in the x direction from an edge of the second electrode Cpr2 of the second capacitor Cpr in the y direction.

Figure 12:
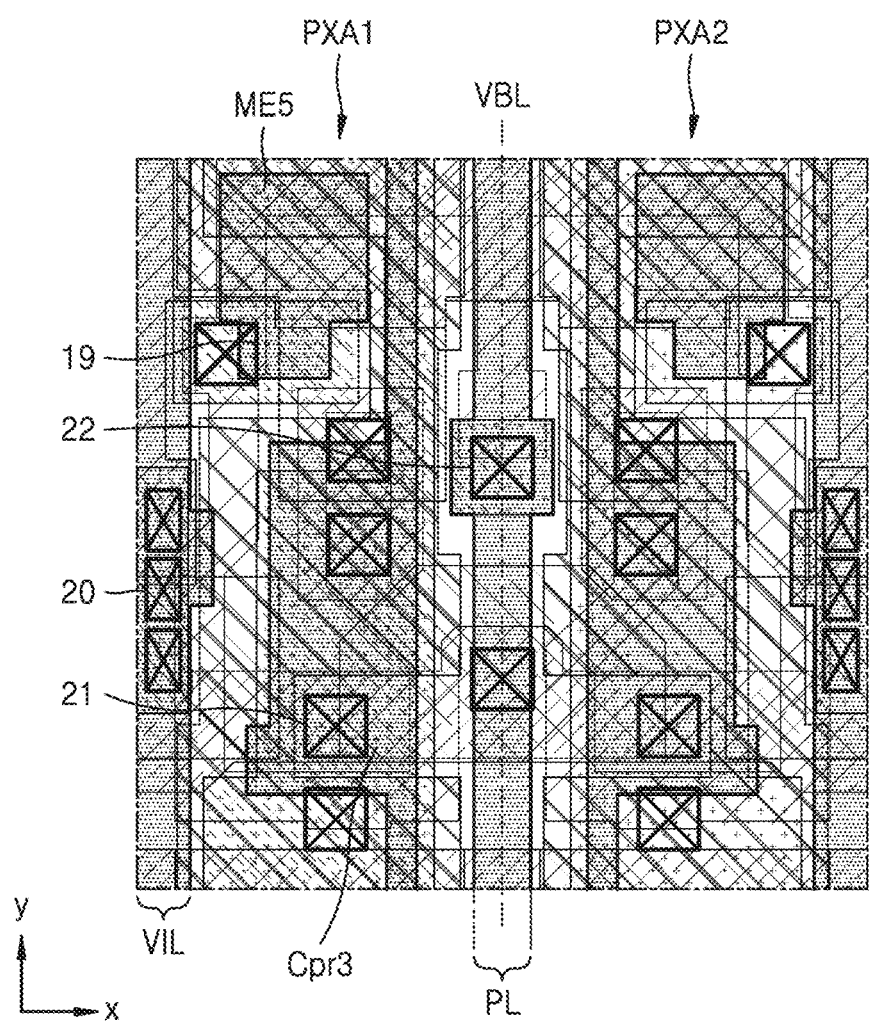
Figure 13:
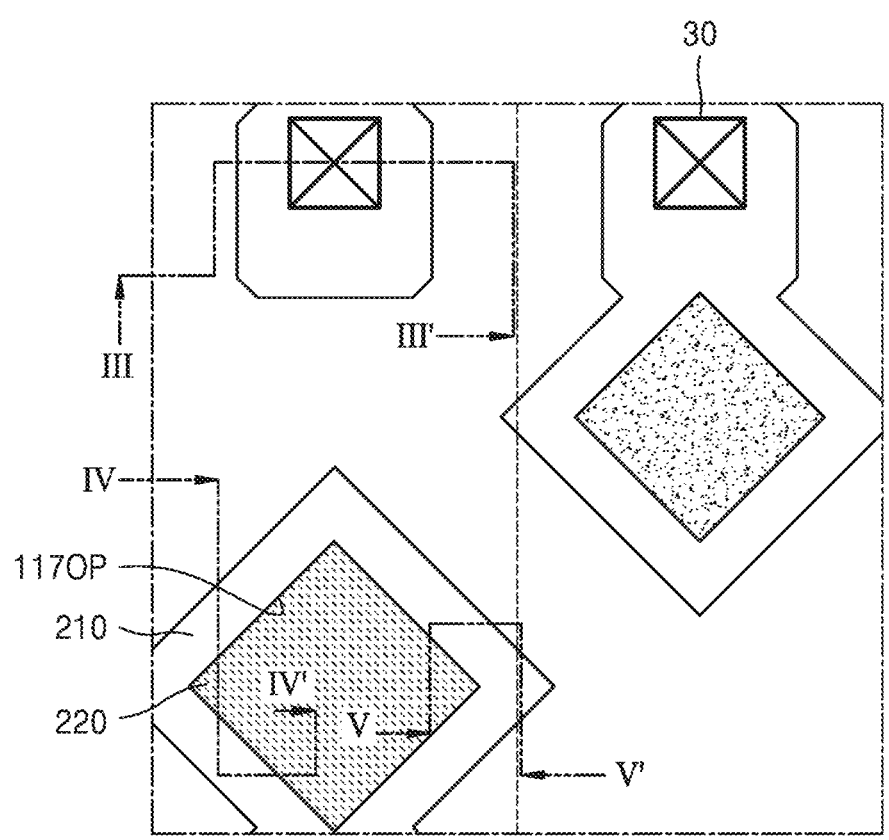

A fifth insulating layer 115 may be disposed above the fourth insulating layer 114 while covering the fourth conductive layer, and a fifth conductive layer may be disposed on the fifth insulating layer 115. As shown in FIG. 12, the fifth conductive layer may include an upper electrode Cpr3 of the first electrode of the second capacitor Cpr, the initialization voltage line VIL, the driving voltage line PL, and a conductive pattern ME5.

The upper electrode Cpr3 of the second capacitor Cpr may extend in the y direction, and may overlap the lower electrode Cpr1 of the second capacitor Cpr and the second electrode Cpr2 of the second capacitor Cpr. The upper electrode Cpr3 of the second capacitor Cpr may be electrically connected to the lower electrode Cpr1 of the second capacitor Cpr through a contact hole 21 of the fourth insulating layer 114 and the fifth insulating layer 115.

The initialization voltage line VIL may extend in the y direction. The initialization voltage line VIL may be electrically connected to the conductive pattern ME2 through a contact hole 20 of the fourth insulating layer 114, and the fifth insulating layer 115. Accordingly, the initialization voltage line VIL may be electrically connected to the gate electrode G2 of the second transistor T2 and the second electrode Cst2 of the first capacitor Cst.

The driving voltage line PL may extend in the y direction. The driving voltage line PL may be electrically connected to the conductive pattern ME4 through a contact hole 22 of the fourth insulating layer 114 and the fifth insulating layer 115. The driving voltage line PL may be shared by the pixel circuit of the first pixel area PXA1 and the pixel circuit of the second pixel area PXA2.

The conductive pattern ME5 may be electrically connected to the conductive pattern ME3 through the contact hole 19 of the fourth insulating layer 114 and the fifth insulating layer 115.

A sixth insulating layer 116 may be disposed above the fifth insulating layer 115 while covering the fifth conductive layer, and the organic light-emitting device OLED may be disposed on the sixth insulating layer 116. The organic light-emitting device OLED may include a pixel electrode 210, an opposite electrode 230, and an intermediate layer between the pixel electrode 210 and the opposite electrode 230.

In an embodiment, each of the first insulating layer 111, the second insulating layer 112, and the third insulating layer 113 may be an inorganic insulating layer IIL. Each of the fourth insulating layer 114 and the fifth insulating layer 115 may be an organic insulating layer.

The pixel electrode 210 may be connected to the first transistor T1 by being electrically connected to the conductive pattern ME5 through a contact hole 30 of the sixth insulating layer 116.

Referring to FIG. 14, a pixel-defining layer 117 covering an edge of the pixel electrode 210 may be disposed above the pixel electrode 210. An opening 117OP may be defined in the pixel-defining layer 117, The opening 117OP may expose a portion of the pixel electrode 210 and define an emission area. The pixel-defining layer 117 may be an organic insulating layer and/or inorganic insulating layer of a single layer or multilayer.

The intermediate layer may include an emission layer 220, a first functional layer disposed under the emission layer 220, and/or a second functional layer disposed above the emission layer 220. The first functional layer may be a hole transport layer (HTL). Alternatively, the first functional layer may include a hole injection layer (HIL) and a hole transport layer (HTL). The second functional layer may include an electron transport layer (ETL) and/or an electron injection layer (EIL). The first functional layer and the second functional layer may be integrally formed to correspond to a plurality of organic light-emitting devices OLED included in the display area. The first functional layer or the second functional layer may be omitted.

The opposite electrode 230 may be integrally formed to correspond to the plurality of organic light-emitting devices OLED included in the display area.

Figure 15:
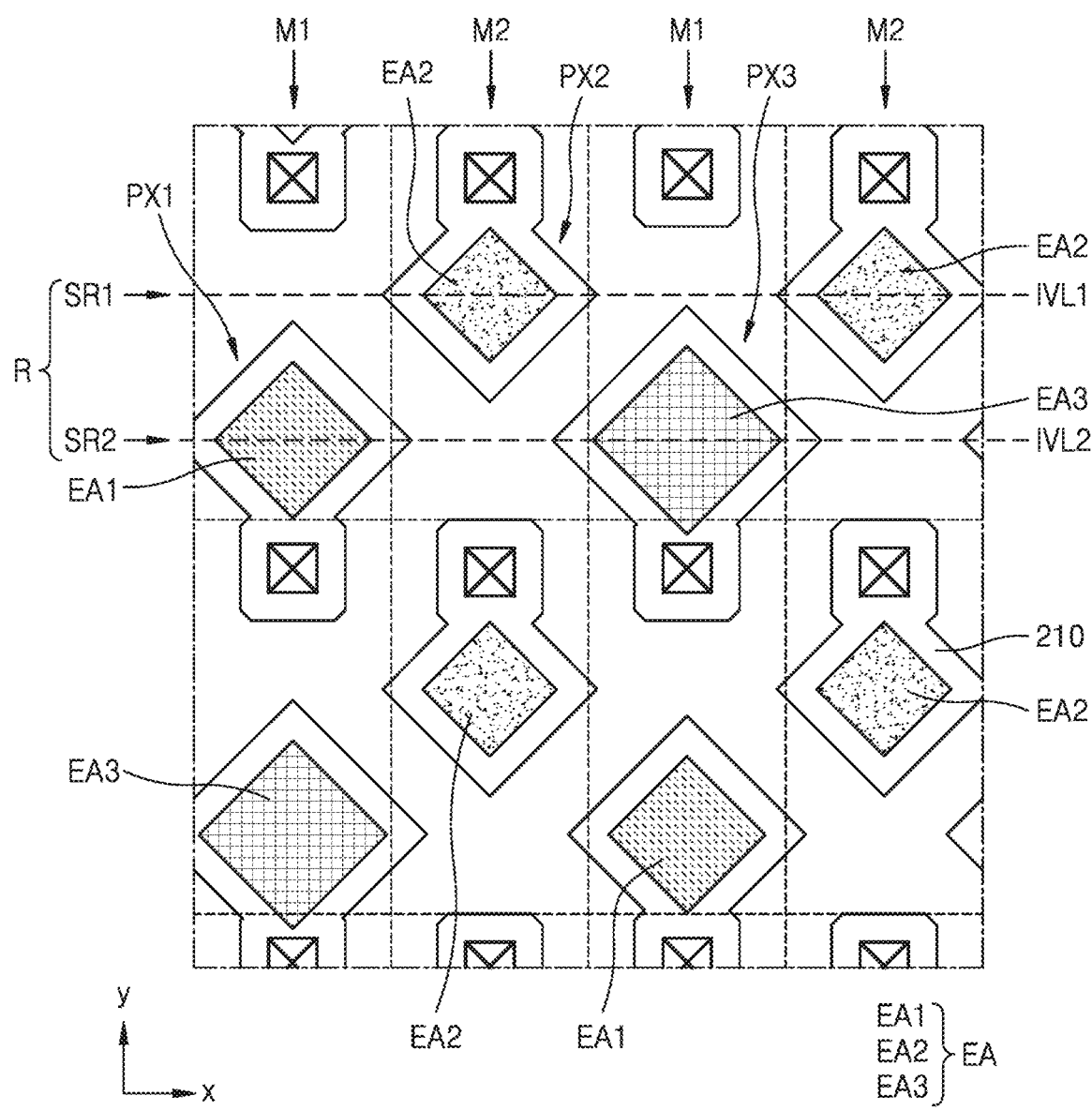
FIG. 15 is a schematic view of a structuring of emission areas of a plurality of pixels, according to an embodiment.

FIG. 15 is a schematic view of a structuring of emission areas of a plurality of pixels PX, according to an embodiment.

Referring to FIG. 15, the plurality of pixels PX may be arranged in the display area. Each of the pixels PX may include a pixel circuit and the organic light-emitting device OLED electrically connected to the pixel circuit. The pixel PX may emit, for example, red light, green light, blue light, or white light via the organic light-emitting device OLED. The plurality of pixels PX may include a first pixel PX1 emitting first-color light, a second pixel PX2 emitting second-color light, and a third pixel PX3 emitting third-color light. For example, the first pixel PX1 may be a red pixel, the second pixel PX2 may be a green pixel, and the third pixel PX3 may be a blue pixel.

The first pixel PX1, the second pixel PX2, and the third pixel PX3 may be repeatedly arranged in the x direction and the y direction according to a certain pattern. FIG. 15 illustrates the pixel electrode 210 and an emission area EA of each of the first pixel PX1, the second pixel PX2, and the third pixel PX3. The emission area EA is where the emission layer 220 of the organic light-emitting device OLED is arranged. The emission area EA may be defined by the opening 117OP of the pixel-defining layer 117. Since the emission layer 220 is disposed on the pixel electrode 210, the structuring of emission area shown in FIG. 15 may indicate a structuring of pixel electrodes or a structuring of pixels. The emission area EA may have a polygonal shape such as a quadrangle or an octagon, a circular shape, or an elliptical shape, and the polygonal shape may include a shape with rounded corners (vertexes).

In a first column M1, a first emission area EA1 of the first pixel PX1 and a third emission area EA3 of the third pixel PX3 may be alternately arranged in the y direction. In a second column M2, a second emission area EA2 of the second pixel PX2 may be repeatedly arranged in the y direction. The first column M1 and the second column M2 may be alternately positioned in the x direction, and a positioning of the first emission area EA1 of the first pixel PX1 and the third emission area EA3 of the third pixel PX3 of first columns M1 adjacent to each other may be opposite to each other.

In a first sub-row SR1 of each row R, the second emission area EA2 of the second pixel PX2 may be repeatedly arranged in the x direction along a virtual straight line IVL1. In a second sub-row SR2, the first emission area EA1 of the first pixel PX1 and the third emission area EA3 of the third pixel PX3 may be alternately arranged in the x direction along a virtual straight line IVL2. In other words, in each row R, the first emission area EA1 of the first pixel PX1, the second emission area EA2 of the second pixel PX2, the third emission area EA3 of the third pixel PX3, and the second emission area EA2 of the second pixel PX2 may be repeatedly arranged in a zigzag manner.

The first emission area EA1 of the first pixel PX1, the second emission area EA2 of the second pixel PX2, and the third emission area EA3 of the third pixel PX3 may have different areas. In an embodiment, the third emission area EA3 of the third pixel PX3 may have a larger area than that of the first emission area EA1 of the first pixel PX1. In addition, the third emission area EA3 of the third pixel PX3 may have a larger area than that of the second emission area EA2 of the second pixel PX2. The first emission area EA1 of the first pixel PX1 may have a larger area than that of the second emission area EA2 of the second pixel PX2. In an embodiment, the third emission area EA3 of the third pixel PX3 may have the same area as that of the first emission area EA1 of the first pixel PX1. However, in an embodiment, the first emission area EA1 of the first pixel PX1 may be larger than the second emission area EA2 of the second pixel PX2 and the third emission area EA3 of the third pixel PX3, and various modifications may be made.

The first pixel area PXA1 in which a pixel circuit of the first pixel PX1 or the third pixel PX3 is arranged and the second pixel area PXA2 in which a pixel circuit of the second pixel PX2 is arranged may be repeated in each row of the substrate 100 in the x direction.

The organic light-emitting device OLED may be disposed on an upper layer of a pixel circuit. The organic light-emitting device OLED may be disposed directly above a pixel circuit to overlap the pixel circuit, or may be arranged to be offset from a pixel circuit and partially overlap a pixel circuit of another pixel arranged in an adjacent row and/or column. For example, the pixel electrode 210 and second emission area EA2 of the second pixel PX2 may be disposed directly above a pixel circuit of the second pixel PX2 to overlap the pixel circuit of the second pixel PX2. The pixel electrode 210 and first emission area EA1 of the first pixel PX1 may overlap the pixel circuit of the third pixel PX3 arranged in the first pixel area PXA1 adjacent thereto in the y direction. The pixel electrode 210 and third emission area EA3 of the third pixel PX3 may overlap the pixel circuit of the first pixel PX1 arranged in the first pixel area PXA1 adjacent thereto in the y direction.

Figure 16:
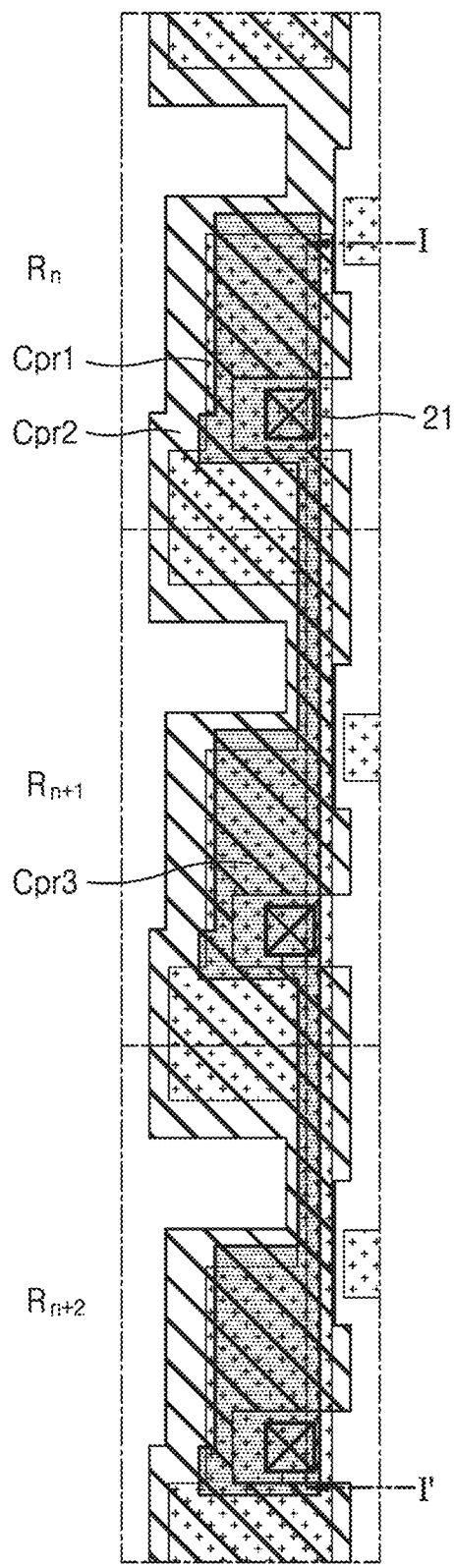
FIG. 16 is a plan view of a second capacitor according to an embodiment.
Figure 17:
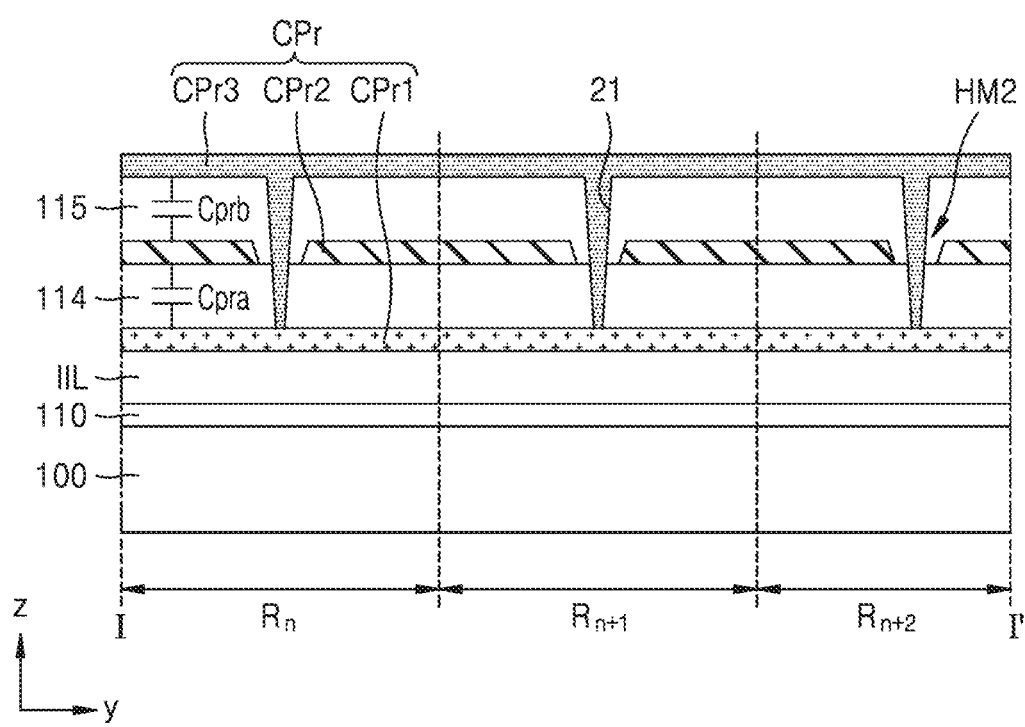
FIG. 17 is a cross-sectional view of the second capacitor taken along line I-I' of FIG. 16.
Figure 18A:
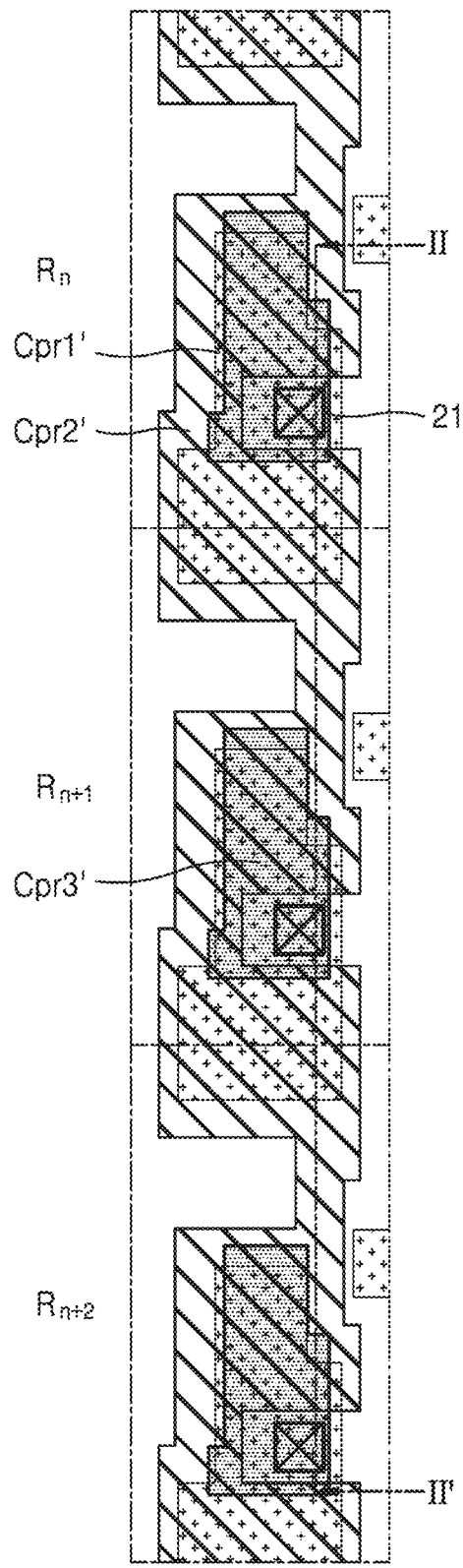
FIG. 18A is a plan view of a second capacitor according to a comparative example.
Figure 18B:
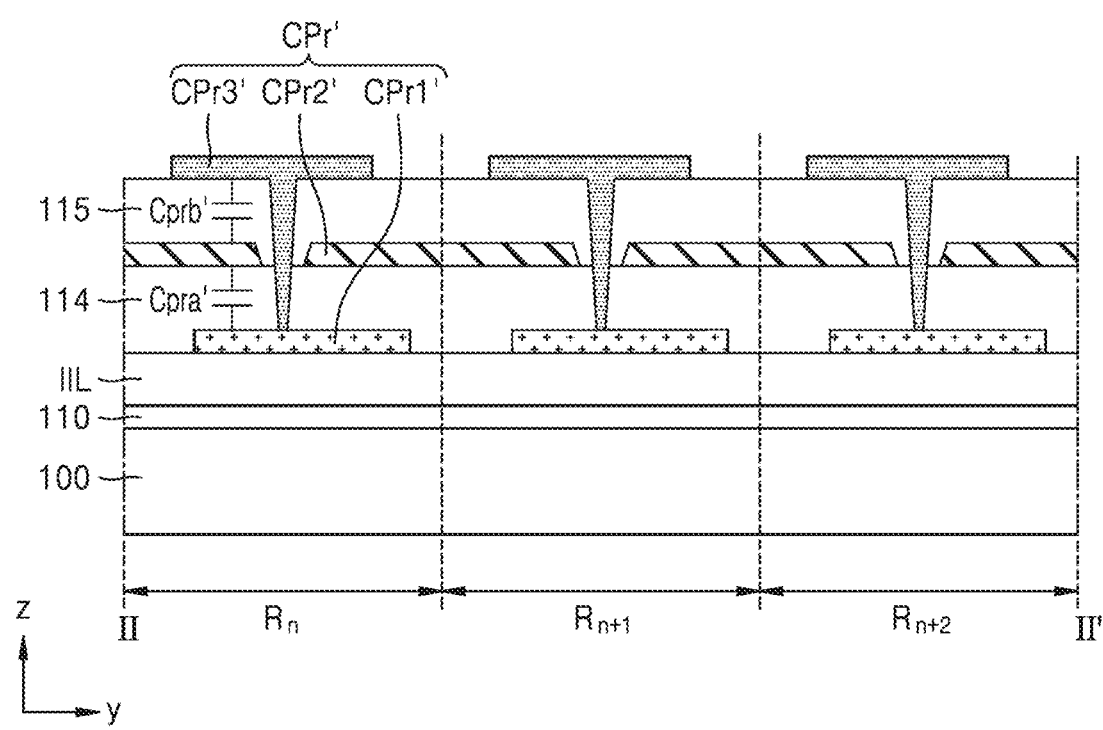
FIG. 18B is a cross-sectional view of the second capacitor taken along line II-II' of FIG. 18A.

FIG. 16 is a plan view of a second capacitor according to an embodiment. FIG. 17 is a cross-sectional view of the second capacitor taken along line I-I' of FIG. 16. FIG. 18A is a plan view of a second capacitor according to a comparative example. FIG. 18B is a cross-sectional view of the second capacitor taken along line II-II' of FIG. 18A.

The second capacitor Cpr may include a first electrode and the second electrode Cpr2, and the first electrode may include the lower electrode Cpr1 and the upper electrode Cpr3.

Pixel circuits of a plurality of rows of the same column may share the second capacitor Cpr. For example, as shown in FIGS. 16 and 17, the second capacitor Cpr may be arranged over pixel areas of three rows of an $n^{th}$ row Rn, $n+1^{th}$ row Rn+1, and $n+2^{th}$ row Rn+2 of the same column. Each of the lower electrode Cpr1 of the second capacitor Cpr, the second electrode Cpr2 of the second capacitor Cpr, and the upper electrode Cpr3 of the second capacitor Cpr may extend in the y direction, and may be arranged over pixel areas of three rows.

The lower electrode Cpr1 of the second capacitor Cpr and the upper electrode Cpr3 of the second capacitor Cpr may be electrically connected to each other. For example, in a pixel area of each of the $n^{th}$ row Rn, $n+1^{th}$ row Rn+1, and $n+2^{th}$ row Rn+2 of the same column, the upper electrode Cpr3 of the second capacitor Cpr may be electrically connected to the lower electrode Cpr1 through the contact hole 21 of the fourth insulating layer 114 and the fifth insulating layer 115. The contact hole 21 may be arranged to correspond to the groove HM2 of the second electrode Cpr2 of the second capacitor Cpr.

The second capacitor Cpr may include a first sub-capacitor Cpra formed between the lower electrode Cpr1 of the second capacitor Cpr and the second electrode Cpr2 of the second capacitor Cpr, and a second sub-capacitor Cprb formed between the second electrode Cpr2 of the second capacitor Cpr and the upper electrode Cpr3 of the second capacitor Cpr.

In a comparative example, as shown in FIGS. 18A and 18B, each of a lower electrode Cpr1' of a second capacitor Cpr' and an upper electrode Cpr3' of the second capacitor Cpr' may be arranged in an island type in each of pixel areas of three rows of the $n^{th}$ row Rn, $n+1^{th}$ row Rn+1, and $n+2^{th}$ row Rn+2 of the same column. As shown in FIG. 18B, in a pixel area of each of the $n^{th}$ row Rn, $n+1^{th}$ row Rn+1, and $n+2^{th}$ row Rn+2 of the same column, the upper electrode Cpr3' of the second capacitor Cpr' may be electrically connected to the lower electrode Cpr1' through the contact hole 21 of the fourth insulating layer 114 and the fifth insulating layer 115. The contact hole 21 may correspond to the groove HM2 of a second electrode Cpr2' of the second capacitor Cpr'.

The second capacitor Cpr' may include a sub-capacitor Cpra' formed between the lower electrode Cpr1' of the second capacitor Cpr' and the second electrode Cpr2' of the second capacitor Cpr', and a sub-capacitor Cprb' formed between the second electrode Cpr2' of the second capacitor Cpr' and the upper electrode Cpr3' of the second capacitor Cpr'.

Compared to a comparative example, in an embodiment, since pixel circuits of three rows of the same column share the second capacitor Cpr, a size of the second capacitor Cpr may be increased without an increase in area of a pixel area, such that a capacitance may be increased.

The pixel circuit PC has been described with the numbers of transistors and capacitors and circuit designs described with reference to FIGS. 2 and 4, and various modifications may be made to the numbers thereof and circuit designs as long as the second capacitor Cpr is included. For example, transistors of a pixel circuit may be N-type transistors, or transistors and/or capacitors may be omitted and/or added.

According to embodiment, there may be provided a display apparatus having improved display quality by minimizing a luminance deviation between pixels. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
  a substrate in which a first pixel area and a second pixel area adjacent to the first pixel area in a first direction are defined;
  a first capacitor in the first pixel area and comprising a first conductive layer and a second conductive layer disposed above the first conductive layer and overlapping the first conductive layer;
  a second capacitor in the second pixel area and comprising a third conductive layer and a fourth conductive layer disposed above the third conductive layer and overlapping the third conductive layer; and
  a third capacitor in the first pixel area and the second pixel area,
  wherein the third capacitor comprises:
  a fifth conductive layer extending in the first direction, positioned in the first pixel area and the second pixel area, and disposed above the second conductive layer;
  a sixth conductive layer extending in the first direction, positioned in the first pixel area and the second pixel area, and disposed above the fifth conductive layer and overlapping the fifth conductive layer; and a seventh conductive layer extending in the first direction, positioned in the first pixel area and the second pixel area, disposed above the sixth conductive layer and overlapping the sixth conductive layer, and connected to the fifth conductive layer.

2. The display apparatus of claim 1, wherein the third conductive layer of the second capacitor is in a same layer as the first conductive layer, and
the fourth conductive layer of the second capacitor is in a same layer as the second conductive layer.

3. The display apparatus of claim 1, wherein the seventh conductive layer is connected to the fifth conductive layer in each of the first pixel area and the second pixel area.

4. The display apparatus of claim 1, wherein, further positioned in the first pixel area are:
a first voltage line extending in the first direction;
a second voltage line extending in the first direction;
a first transistor including a first electrode connected to the first voltage line, and including a second electrode connected to a display element;
a second transistor connected between a gate electrode of the first transistor and the second electrode of the first transistor; and
a third transistor connected between the gate electrode of the first transistor and the second transistor and in series with the second transistor.

5. The display apparatus of claim 4, wherein the first conductive layer of the first capacitor is connected to the gate electrode of the first transistor, and the second conductive layer of the first capacitor is connected to the second voltage line.

6. The display apparatus of claim 4, wherein the fifth conductive layer of the third capacitor is connected to a node between the second transistor and the third transistor, and the sixth conductive layer of the third capacitor is a data line.

7. The display apparatus of claim 4, wherein the gate electrode of the first transistor is the first conductive layer of the first capacitor.

8. The display apparatus of claim 4, wherein the first voltage line and the second voltage line are in a same layer as the seventh conductive layer.

9. The display apparatus of claim 4, further comprising a gate line extending in a second direction perpendicular to the first direction, and connected to a gate electrode of the third transistor.

10. The display apparatus of claim 9, wherein the gate line is in a same layer as the second conductive layer.

11. The display apparatus of claim 9, wherein a gate electrode of the second transistor is connected to the second voltage line.

12. The display apparatus of claim 1, wherein a groove corresponding to a portion of the fifth conductive layer is defined in the sixth conductive layer.

13. The display apparatus of claim 1, wherein further positioned in the first pixel area are:
a semiconductor layer comprising one end and an other end, the one end being connected to the first conductive layer of the first capacitor, and the other end being connected to the fifth conductive layer of the third capacitor;
an eighth conductive layer overlapping between the one end and the other end of the semiconductor layer; and
a ninth conductive layer connected to the eighth conductive layer and extending in a second direction perpendicular to the first direction,
the eighth conductive layer is in a same layer as the first conductive layer of the first capacitor, and
the ninth conductive layer is in a same layer as the second conductive layer of the first capacitor.

14. The display apparatus of claim 1, wherein further positioned in the first pixel area are:
a semiconductor layer comprising one end and an other end, the one end being connected to a display element, and the other end being connected to the fifth conductive layer of the third capacitor; and
an eighth conductive layer overlapping between the one end and the other end of the semiconductor layer and connected to the second conductive layer of the first capacitor, and
the eighth conductive layer is in a same layer as the first conductive layer of the first capacitor.

15. An electronic apparatus comprising the display apparatus of claim 1.

16. The electronic apparatus of claim 15, wherein the electronic apparatus is a flexible apparatus.

* * * * *